United States Patent
Hsu et al.

(10) Patent No.: US 11,562,118 B2
(45) Date of Patent: Jan. 24, 2023

(54) HARD-TO-FIX (HTF) DESIGN RULE CHECK (DRC) VIOLATIONS PREDICTION

(71) Applicant: Taiwan Semiconductor Manufacturing Company, Ltd., Hsinchu (TW)

(72) Inventors: Ching Hsu, Hsinchu County (TW); Shih-Yao Lin, Hsinchu (TW); Yi-Lin Chuang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 95 days.

(21) Appl. No.: 17/140,701

(22) Filed: Jan. 4, 2021

(65) Prior Publication Data

US 2022/0215149 A1 Jul. 7, 2022

(51) Int. Cl.
*G06F 30/398* (2020.01)
*G06F 30/392* (2020.01)
*G06N 5/04* (2006.01)
*G06N 20/00* (2019.01)

(52) U.S. Cl.
CPC .......... *G06F 30/398* (2020.01); *G06F 30/392* (2020.01); *G06N 5/04* (2013.01); *G06N 20/00* (2019.01)

(58) Field of Classification Search
CPC .. G06F 30/398; G06F 30/392; G06F 2115/12; G06N 5/04; G06N 20/00
See application file for complete search history.

(56) References Cited

U.S. PATENT DOCUMENTS

| | | | |
|---|---|---|---|
| 10,592,634 B1* | 3/2020 | Baranwal | G06N 5/045 |
| 11,042,806 B1* | 6/2021 | Jiang | G06F 30/398 |
| 2019/0147127 A1* | 5/2019 | Su | G03F 7/70525 |
| | | | 703/7 |
| 2019/0266310 A1* | 8/2019 | Schroeder | G06F 30/398 |
| 2019/0311290 A1* | 10/2019 | Huang | G01R 31/317 |
| 2019/0325321 A1* | 10/2019 | Swanson | G06K 9/6267 |
| 2020/0004918 A1* | 1/2020 | Sha | G03F 7/705 |
| 2020/0104457 A1* | 4/2020 | Chuang | G06F 30/327 |
| 2020/0125695 A1* | 4/2020 | Shao | G03F 7/705 |
| 2021/0042460 A1* | 2/2021 | Lin | G06F 30/3308 |
| 2021/0081509 A1* | 3/2021 | Salik | G06F 30/27 |
| 2021/0287120 A1* | 9/2021 | Mamidi | G06N 5/003 |
| 2022/0050949 A1* | 2/2022 | Jiang | G06N 20/00 |
| 2022/0075920 A1* | 3/2022 | Bansal | G06F 30/3315 |
| 2022/0148741 A1* | 5/2022 | Griffor | G16H 50/80 |

* cited by examiner

Primary Examiner — Nha T Nguyen

(74) Attorney, Agent, or Firm — Merchant & Gould, P.C.

(57) ABSTRACT

A method includes: training a machine learning model with a plurality of electronic circuit placement layouts; predicting, by the machine learning model, fix rates of design rule check (DRC) violations of a new electronic circuit placement layout; identifying hard-to-fix (HTF) DRC violations among the DRC violations based on the fix rates of the DRC violations of the new electronic circuit placement layout; and fixing, by an engineering change order (ECO) tool, the DRC violations.

20 Claims, 17 Drawing Sheets

HARD-TO-FIX (HTF) DESIGN RULE CHECK (DRC) VIOLATIONS PREDICTION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a constant need to develop ICs with smaller chip areas, lower costs, and a shorter turn-around-time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
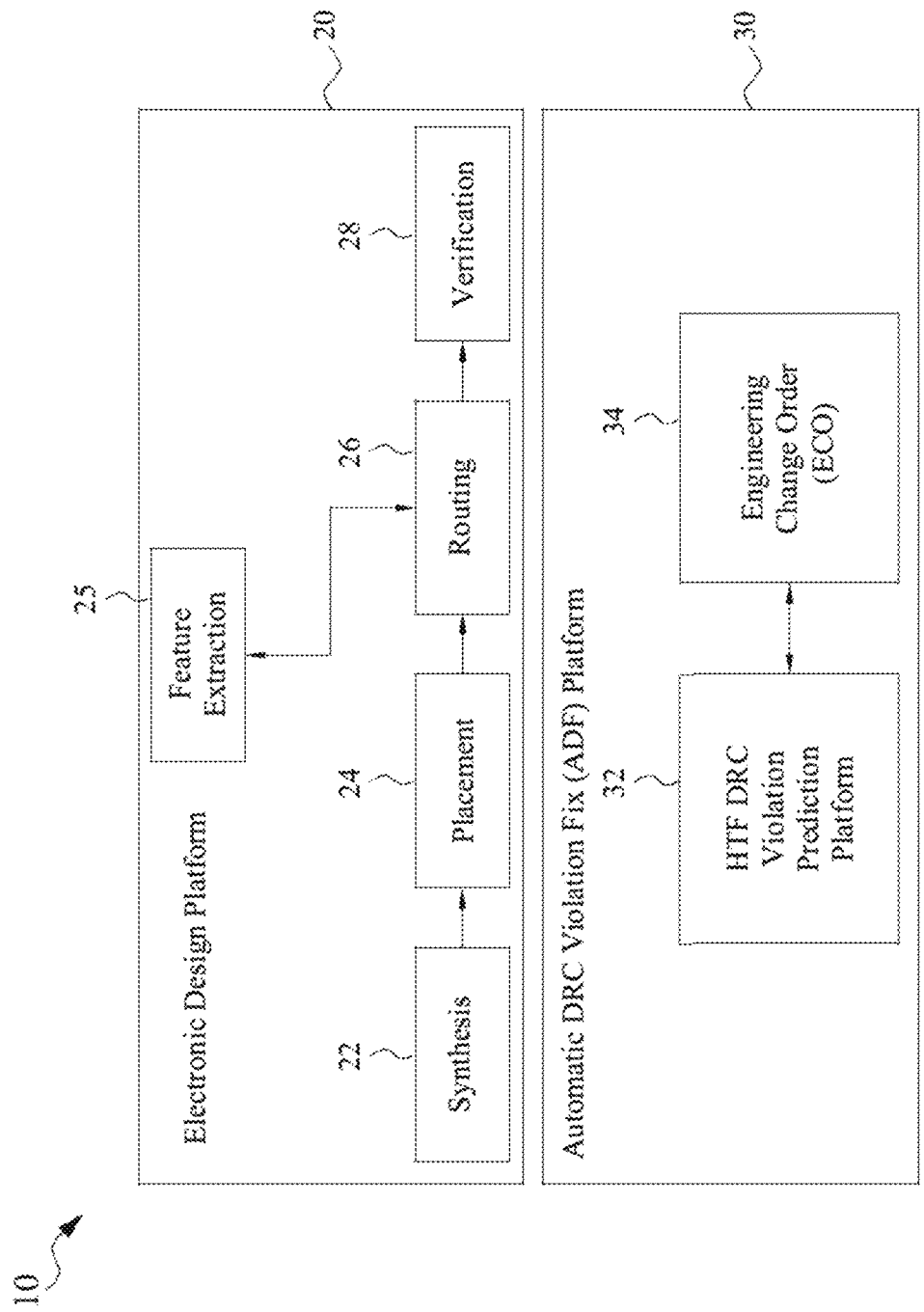
FIG. 1 is a block diagram illustrating of an electronic device design system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In an electronic circuit design process, one or more electronic design automation (EDA) tools may be utilized to design, optimize, and verify semiconductor device designs, such as circuit designs in a semiconductor chip. During placement, a placer tool may produce an (electronic circuit)

placement layout based on a given circuit design, which may be developed by a circuit designer and which may include, for example, circuit design information such as electrical diagrams, high level electrical description of the circuit design, a synthesized circuit netlist, or the like. The placement layout includes information indicating physical positions of various circuit elements of the semiconductor device. After the placement of the device is completed, clock-tree synthesis and routing may be performed. During routing, wires or interconnections may be formed to connect the various circuit elements of the placement layout.

After the placement layout has been routed, the resulting electronic device design may be checked for compliance with various design rules, design specifications, or the like. For example, the electronic device design may be checked for various design rule check (DRC) violations. Some DRC violations may be caused by routing congestion, for example, as routing lines may become congested in certain regions of the electronic device design which can result in DRC violations. Routing congestion can significantly impede efforts to reduce or minimize chip size in various designs.

In a post-layout simulation stage, a physical verification (PV) is performed taking into consideration parameters acquired in previous stages such as a pre-layout simulation. A simulation of transistor-level behavior is conducted to examine whether the chip performance meets the required system specifications. Based on the results of the physical verification, some DRC violations may be fixed. An engineering change order (ECO) operation may be employed to correct the DRC violations. An ECO operation is the process of inserting a logic change directly into the netlist after it has already been processed by an automatic tool. Before the chip masks are made, ECOs are usually done to save time, by avoiding the need for full ASIC logic synthesis, technology mapping, placement, routing, feature extraction, and timing verification. EDA tools are often built with incremental modes of operation to facilitate this type of ECO. Built-in ECO routing may help with implementing physical-level ECOs.

Some DRC violations are hard to fix, called hard-to-fix (HTF) DRC violations. It may be hard for IC designers to tell whether a DRC violation is an HTF DRC violation based on PV results. Some DRC violations inside a cluster of DRC violations may be HTF DRC violations and may not be fixed even after several fix iterations. Some scatter DRC violations may also be HTF DRC violations. Handcrafted HTF fix formula are used to fix HTF DRC violations. Those handcrafted HTF fix formula are based on the experiences of the IC designers. The IC designers may revise those handcrafted HTF fix formula repeatedly during the process of fixing HTF DRC violations. The increase in clusters of DRC violations may result in exponential manual efforts to find proper HTF fix formula.

In accordance with some embodiments, a system and a method for HTF DRC violations prediction are provided. The system and the method utilize machine learning (ML) to identify the severity of DRC violations to predict whether a DRC violation is an HTF DRC violation. The system and the method may minimize dissimilarity among various designs and avoid redundant fix iterations. The system may achieve an in-sample accuracy of about 93% and an out-of-sample accuracy of about 70%.

FIG. 1 is a block diagram illustrating an electronic device design system 10 in accordance with some embodiments. The electronic device design system 10 is operable to predict HTF DRC violations. The electronic device design system 10 includes, among other things, an electronic design platform 20 an automatic DRC violation fix (ADF) platform 30. In some embodiments, the electronic design platform 20 and/or the ADR platform 30 may be implemented in hardware, firmware, software, or any combination thereof. For example, in some embodiments, the electronic design platform 20 and/or the ADR platform 30 may be at least partially implemented as instructions stored on a computer-readable storage medium, which may be read and executed by one or more computer processors or processing circuitry. The computer-readable storage medium may be, for example, read-only memory (ROM), random access memory (RAM), flash memory, hard disk drive, optical storage device, magnetic storage device, electrically erasable programmable read-only memory (EEPROM), organic storage media, or the like.

The electronic design platform 20 may include a plurality of electronic device design tools that may be implemented at least in part as software tools which, when executed by one or more computing devices, processors, or the like, can be utilized to design and generate one or more electronic circuit layouts, including electronic circuit placement layouts and associated routing for electronic devices circuits, which may include, for example, one or more integrated circuits (ICs).

In some embodiments, the electronic design platform 20 and the ADF platform 30 may be included in or otherwise implemented by a same apparatus, such as a same computing system or device. In other embodiments, the electronic design platform 20 and the ADF platform 30 may be included in or otherwise implemented by separate apparatuses, such as separate and remotely located computing systems or devices.

The electronic design platform 20 includes electronic device design tools which can be used, for example, to design high-level programming descriptions of analog and/or digital circuitry for an electronic device. In some embodiments, the high-level programming descriptions can be implemented using a high-level programming language, such as C, C++, LabVIEW, MATLAB, a general purpose system design or modeling language, such as SysML, SMDL and/or SSDL, or any other suitable high-level programming language. In some embodiments, the electronic design platform 20 may include various additional features and functionalities, including, for example, one or more tools suitable to simulate, analyze, and/or verify the high-level programming descriptions of circuitry for the electronic device.

In some embodiments, the electronic design platform 20 includes a synthesis tool 22, a placement tool 24, a feature extraction tool 25, and a routing tool 26, each of which may be implemented at least in part as software tools accessible to and executable by one or more computing devices, processors or the like.

The synthesis tool 22 translates one or more characteristics, parameters, or attributes of the electronic device into one or more logic operations, one or more arithmetic operations, one or more control operations, or the like, which may then be translated into the high-level programming descriptions in terms of the analog circuitry and/or the digital circuitry.

The placement tool 24 generates cells which correspond to, or otherwise implement, the one or more logic operations, one or more arithmetic operations, one or more control operations, or the like produced by the synthesis tool 22. The cells may include geometric shapes which correspond to various features of semiconductor devices, including, for example, diffusion layers, polysilicon layers, metal layers, and/or interconnections between layers. In some embodiments, the placement tool 24 may provide one or more high-level software level descriptions of the geometric shapes, the locations of the geometric shapes, and/or the interconnections between the geometric shapes.

In some embodiments, the geometric shapes for some of the analog circuitry and/or the digital circuitry can be defined in accordance with a standard cell from among a predefined library of standard cells associated with a technology library. The standard cell represents one or more semiconductor devices as well as their interconnection structures that are configured and arranged to provide a logical function, such as AND, OR, XOR, XNOR, or NOT, or a storage function, such as a flipflop or a latch. The predefined library of standard cells may be defined in terms of geometric shapes which correspond to diffusion layers, polysilicon layers, metal layers, and/or interconnections between layers. Thereafter, the placement tool 24 assigns locations for the geometric shapes on a printed circuit board (PCB) and/or a semiconductor substrate.

The electronic design platform 20 may perform clock tree synthesis (CTS) on a design generated, for example, by the placement tool 24. In some embodiments, the placement tool 24 may perform the clock tree synthesis. In other embodiments, a CTS tool may be included in the electronic design platform 20 to perform CTS on designs received from the placement tool 24. Clock tree synthesis generally refers to a process of synthesizing a clock tree to achieve zero or minimal skew and insertion delay, and may include inserting one or more buffers or inverters along clock paths of the electronic device design.

The routing tool 26 produces physical interconnections between the cells or the geometric shapes in the placement layout provided by the placement tool 24. In some embodiments, the routing tool 26 utilizes a textual or an image-based netlist describing the analog circuitry, the digital circuitry, the technology library, a semiconductor foundry for fabricating the electronic device and/or a semiconductor technology node for fabricating the electronic device to assign the interconnections between the geometric shapes.

The verification tool 28 may perform various verifications or checks on an electronic circuit placement layout, e.g., after placement and routing. For example, in some embodiments, the verification tool 28 can analyze the electronic circuit placement layout and can provide a static timing analysis (STA), a voltage drop analysis, also referred to an IREM analysis, a Clock Domain Crossing Verification (CDC check), a formal verification, also referred to as model checking, equivalence checking, or any other suitable analysis and/or verification. In some embodiments, the verification tool 28 can perform an alternating current (AC) analysis, such as a linear small-signal frequency domain analysis, and/or a direct current (DC) analysis, such as a nonlinear quiescent point calculation or a sequence of nonlinear operating points calculated while sweeping a voltage, a current, and/or a parameter to perform the STA, the IREM analysis, or the like.

The verification tool 28 verifies that the electronic device design, including the layout of the cells or geometric shapes provided by the placement tool 24, as well as the interconnections between the cells or geometric shapes provided by the routing tool 26, satisfies one or more specifications, rules, or the like associated with the electronic device design. The verification tool 28 may perform a physical verification, in which the verification tool 28 verifies whether an electronic device design is physically manufacturable, and that the resulting chips will meet the design specifications and will not have physical defects which prevent the chips from functioning as designed.

The verification tool 28 may perform a DRC to determine whether the electronic device design, including the geometric shapes, the locations of the geometric shapes, and/or the interconnections between the geometric shapes assigned by the placement tool 24 and/or the routing tool 26, satisfies a series of recommended parameters, referred to as design rules, as may be defined by a semiconductor foundry and/or semiconductor technology node for fabricating the electronic device. The verification tool 28 may determine the presence of one or more DRC violations in the electronic device design, and in some embodiments, the verification tool 28 may generate a DRC-violation map indicating a location of the one or more DRC violations in the electronic device design.

The feature extraction tool 25 may perform feature extraction on the electronic circuit placement layout, including the physical interconnections between the cells or the geometric shapes in the placement layout produced by the routing tool 26. In other words, the feature extraction is performed at a post-routing stage. In some embodiments, the feature extraction tool 25 may extract information associated with one or more features of the electronic circuit placement layout. The extracted features may include any characteristics or parameters associated with the electronic circuit placement layout. In some embodiments, the feature extraction tool 25 analyzes a plurality of regions of the electronic circuit placement layout and extracts features associated with each of the plurality of regions. For example, the feature extraction tool 25 may perform feature extraction on each of a plurality of grid units of the electronic circuit placement layout and/or on each of a plurality of neighboring grid units of the electronic circuit placement layout. The feature extraction tool 25 may be implemented at least in part as software tools accessible to and executable by one or more computing devices, processors or the like. In some embodiments, the feature extraction tool 25 may be implemented as circuitry operable to perform any of the functions described herein with respect to the feature extraction tool 25.

Figure 2:
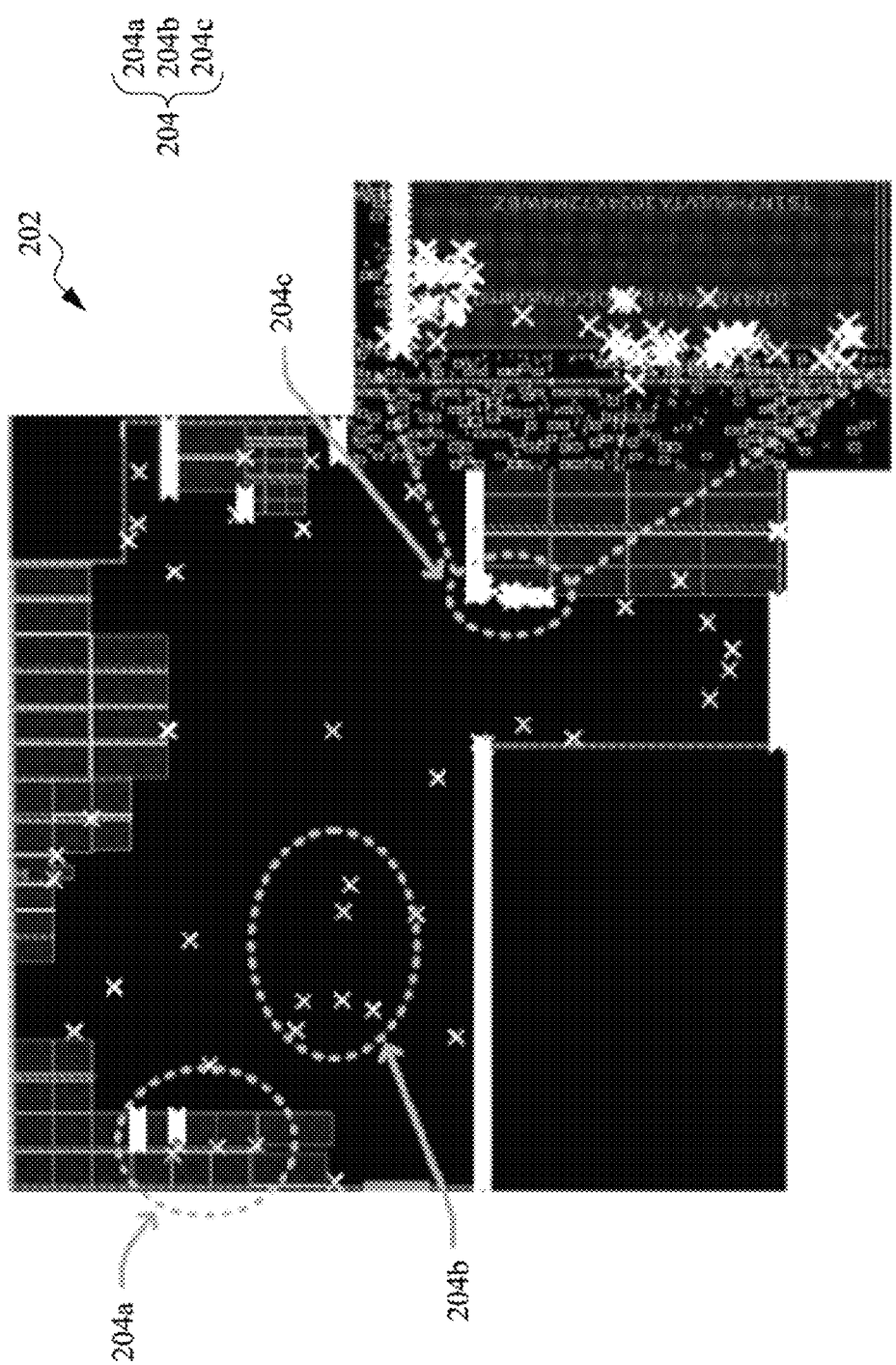
FIG. 2 is a diagram illustrating an example DRC-violation map in accordance with some embodiments.

FIG. 2 is a diagram illustrating an example DRC-violation map 202 in accordance with some embodiments. In this example, the DRC-violation map 202 includes DRC violations 204, associated with a specific electronic circuit placement layout, identified by the verification tool 28. The DRC violations 204 may be classified as three categories, namely structural DRC violations 204a, scatter DRC violations 204b, and cluster DRC violations 204c. Structural DRC violations 204a are DRC violations associated with structural factors such as wrong routing blockage creation, unfriendly input/output (I/O) pin setup, power ground (PG) violations. Structural DRC violations 204a are generally inapplicable to fix in engineering change order (ECO) manner and big changes at earlier stages are needed. Structural DRC violations 204a generally are fixed by users. Scatter DRC violations 204b are DRC violations that are scattered across the electronic circuit placement layout of the design. Scatter DRC violations 204b are generally associated with EDA router algorithms. Scatter DRC violations 204b are generally fixed by the EDA router or ADF, and the fix rate is generally around 85-95%. Scatter DRC violations 204b are not necessarily easy to fix. Some scatter DRC violations 204b may be HTF DRC violations. Cluster DRC violations 204c are DRC violations that cluster around in a small region, as shown in FIG. 2. As shown in the enlarged portion in FIG. 2, there are many cluster DRC violations 204c located in a small region. Cluster DRC violations 204c are generally associated with factors such as insufficient routing resource, clustered complicated cell placement. Cluster DRC violations are generally fixed by EDA router or ADF, and the fix rate is generally around 40-60%. Cluster DRC violations 204c are generally potential HTF DRC violations, but are not necessarily HTF DRC violations. Some cluster DRC violations 204c may not be HTF DRC violations.

Figure 3:
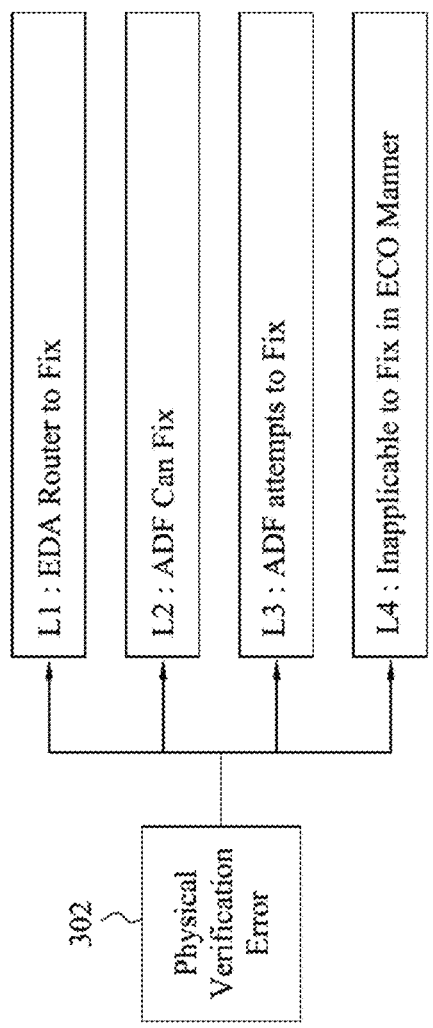
FIG. 3 is a diagram illustrating a classification of DRC violations in accordance with some embodiments.
Figure 4:
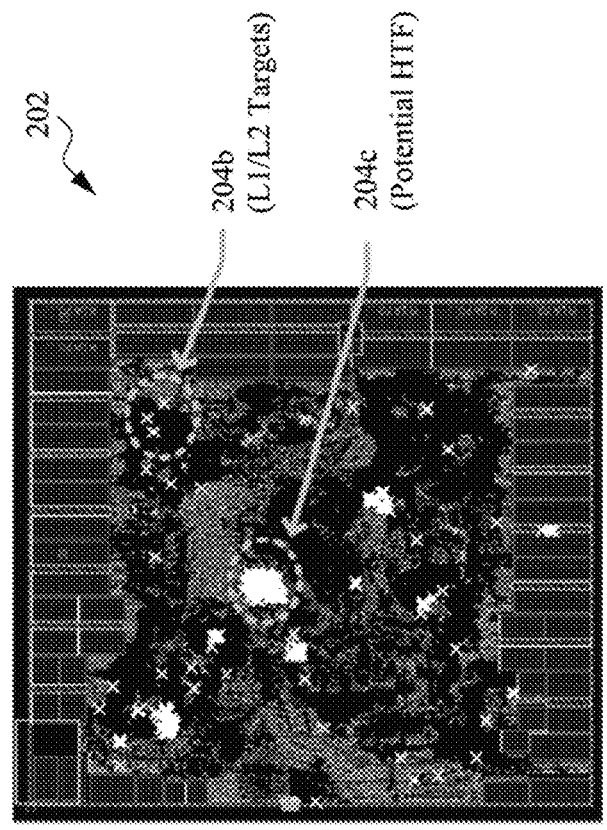
FIG. 4 is a diagram illustrating another example DRC-violation map in accordance with some embodiments.

FIG. 3 is a diagram illustrating a classification of DRC violations in accordance with some embodiments. FIG. 4 is a diagram illustrating another example DRC-violation map 202 in accordance with some embodiments. In general, DRC violations may be classified into different fix difficulty levels to facilitate the ADF process carried out by the ADF platform 30. Based on physical verification error(s) 302, DRC violations are classified as four fix difficulty levels, namely L1, L2, L3, and L4. L1 DRC violations are DRC violations that can be fixed by the EDA router and have a medium to high fix rate depending on EDA router stability. L2 DRC violations are DRC violations that can be fixed by ADF and have a high fix rate. L1 and L2 DRC violations are not considered as HTF DRC violations. The scatter DRC violations 204b shown in FIG. 4 are candidates for L1 and L2 DRC violations.

On the other hand, L3 DRC violations are DRC violations that ADF attempts to fix and a high fix rate is not guaranteed. The cluster DRC violations 204c shown in FIG. 4 are candidates for L3 DRC violation. L4 DRC violations are DRC violations that are inapplicable to fix in ECO manner. Structural DRC violations 204a are often L4 DRC violations. L3 and L4 DRC violations are considered as HTF DRC violations.

As mentioned above, scatter DRC violations 204b are not necessarily L1 or L2 DRC violations; cluster DRC violations 204c are not necessarily L3 DRC violations. If a L3 DRC violation is falsely classified as a L2 DRC violation, the ADF platform 30 might waste resources on fixing a DRC violation that has a low fix rate. As such, drawing the line between L2 DRC violations and L3 DRC violations and accurately predicting HTF DRC violations might increase the efficiency of the ADF platform 30.

Referring back to FIG. 1, the ADF platform 30 is configured to predict the presence of HTF DRC violations in a particular electronic circuit placement layout (including physical interconnections between the cells or the geometric shapes in the placement layout produced by the routing tool 26) and fix DRC violations 204 accordingly. As shown in the example of FIG. 1, the ADF platform 30 may include, among other things, an HTF DRC violation prediction platform 32 and an ECO tool 34. As will be discussed in further detail herein, the HTF DRC violation prediction platform 30 may predict the presence of HTF DRC violations, among all DRC violations (i.e., DRC violations include HTF DRC violations and non-FTF DRC violations), by implementing one or more machine learning approaches, for example, in which past data (such as data indicating presence and/or locations of HTF DRC violations in electronic device designs) is utilized to train a machine learning model to predict the presence of DRC violations based on similarities or deviations between new electronic circuit placement layouts and the past data. The ECO tool 34 may fix DRC violations 204 accordingly. In a non-limiting example, the ECO tool 34 may avoid multiple attempts to fix HTF DRC violations predicted by the HTF DRC violation prediction platform 32. In another non-limiting example, the ECO tool 34 may attempt to fix HTF DRC violations after fixing all of the non-HTF DRC violations.

The HTF DRC violation prediction platform 30 may include a plurality of electronic device analysis and/or design tools which may be implemented at least in part as software tools which, when executed by one or more computing devices, processors, or the like, can be utilized to analyze one or more electronic circuit placement layouts, which may be received, for example, from the electronic design platform 20 (e.g., from the placement tool 24). Additionally, in some embodiments, the HTF DRC violation prediction platform 30 may be utilized to adjust or otherwise provide information to the electronic design platform 20 which indicates one or more adjustments to be made to the placement layout in order to avoid or otherwise reduce the presence of DRC violations in the placement layout.

Figure 17:
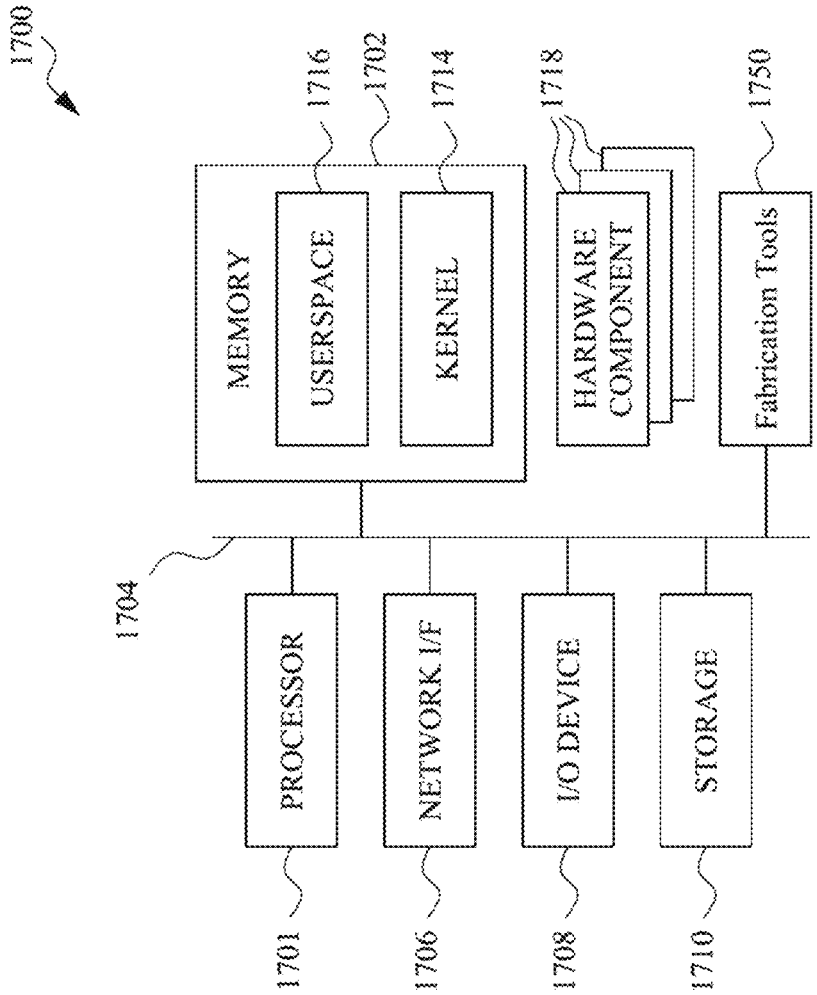
FIG. 17 is a block diagram of a computer system in accordance with some embodiments.

In some embodiments, the HTF DRC violation prediction platform 32 and the ECO tool 34 may be implemented at least in part as software tools accessible to and executable by one or more computing systems as shown in FIG. 17, processors or the like. In some embodiments, the HTF DRC violation prediction platform 32 and the ECO tool 34 may be implemented as circuitry operable to perform any of the functions described herein with respect to the HTF DRC violation prediction platform 32 and/or the ECO tool 34. In some embodiments, the electronic design platform 20 and the ADF platform 30 may be integrated, and may be implemented in a same platform. For example, each of the various tools described herein with respect to the electronic design platform 20 and the ADF platform 30 may be accessed or otherwise implemented, at least in part, by a same apparatus, such as a computer device.

As will be described in further detail below, in some embodiments, the HTF DRC violation prediction platform 32 may employ one or more artificial intelligence (AI) or machine learning (ML) techniques. "Artificial intelligence (AI)" is used herein to broadly describe any computationally intelligent systems and methods that can learn knowledge (e.g., based on training data), and use such learned knowledge to adapt its approaches for solving one or more problems, for example, by making inferences based on a received input, such as placement layouts. "Machine learning (ML)" generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions. In some embodiments, the HTF DRC violation prediction platform 32 may include machine learning circuitry which may be trained to predict the presence of HTF DRC violations based on input training data.

Figure 5:
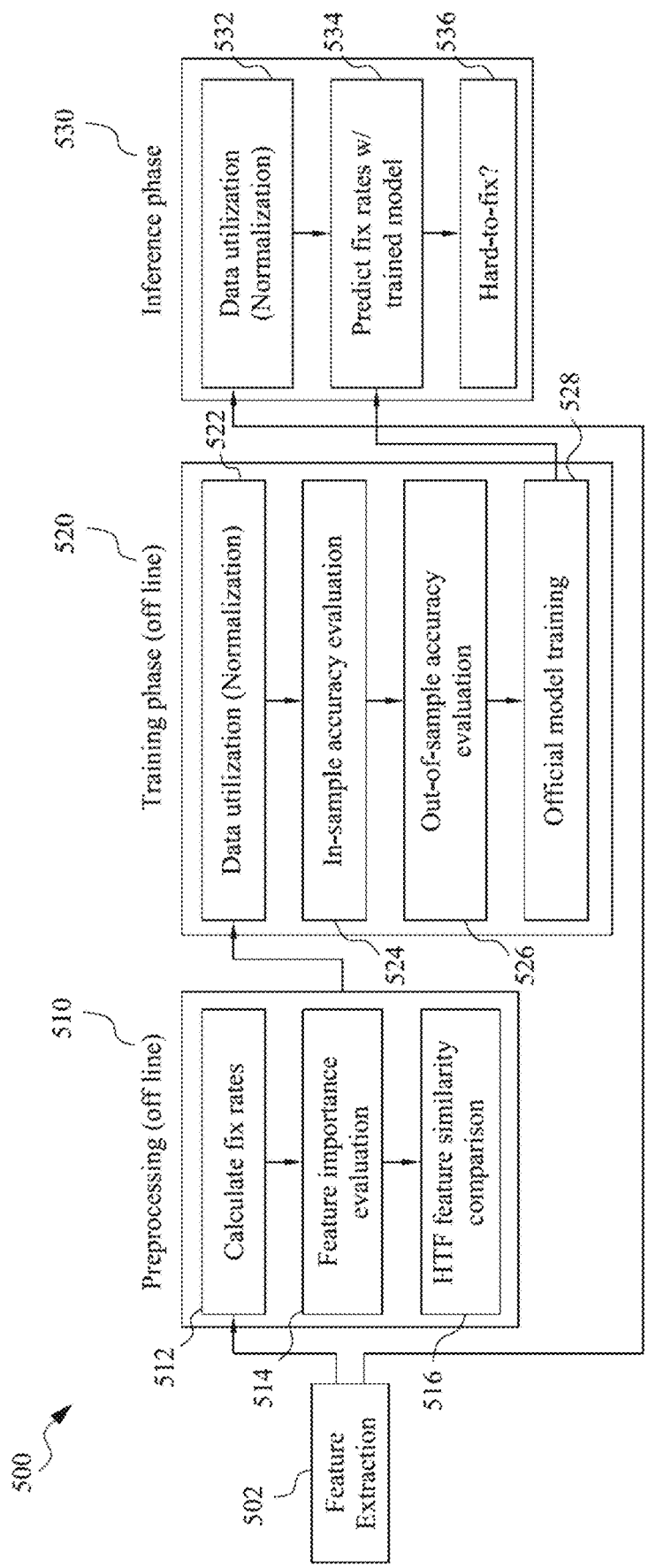
FIG. 5 is a flowchart diagram illustrating a method for HTF DRC violation prediction in accordance with some embodiments.

FIG. 5 is a flowchart diagram illustrating a method 500 for HTF DRC violation prediction in accordance with some embodiments. In general, the relationship between feature combination and corresponding fix rate is obtained during training, and the fix rate of a new electronic device design can be predicted based on the relationship between feature combination and corresponding fix rate.

The method 500 includes three phases, namely a preprocessing phase 510, a training phase 520, and an inference phase 530. At step 502, feature combinations of many electronic device designs are extracted. As mentioned above, the feature extraction may be performed using the feature extraction tool 25 as shown in FIG. 1. For each electronic device design, a feature combination may be a N-dimension vector, where N is an integer larger than one. In some embodiments, the feature combination may be a vector in a high dimension (e.g., thirty-dimension) space. In a non-limiting example, the extracted features may include, for example, metal layer densities of the first ten metal layers; non-default rule (NDR) aware metal layer densities of the first ten metal layers; a cell density; a pin density; a high-pin cell count; a feedthrough net count; and a vertical interconnect access (via) count.

Figure 6:
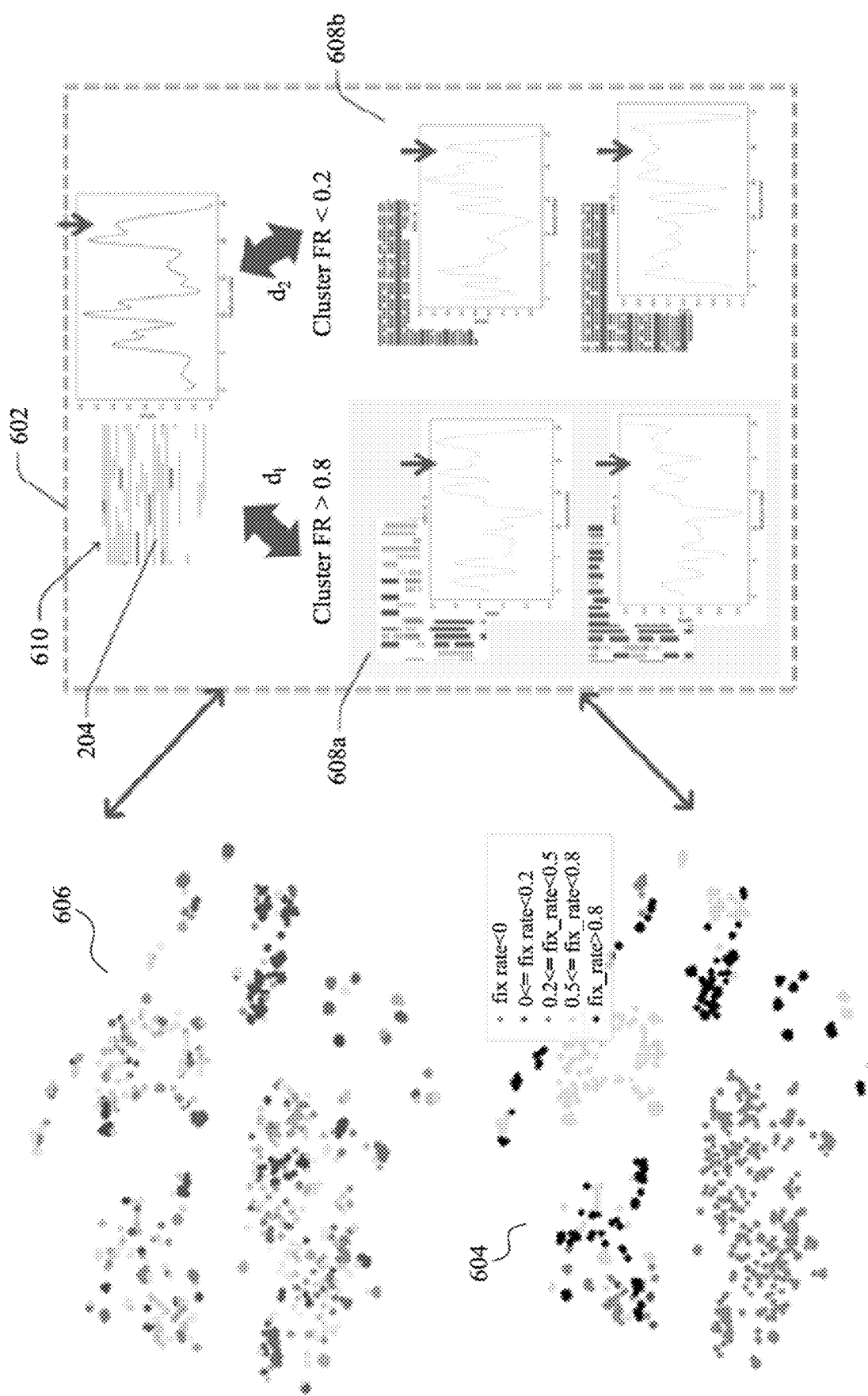
FIG. 6 is a diagram illustrating operations of the HTF DRC violation prediction platform.

In the preprocessing phase 510, which may be offline, fix rates are calculated for DRC violations at step 512, based on the feature extraction at step 502. FIG. 6 is a diagram illustrating operations of the HTF DRC violation prediction platform 32. As shown in FIG. 6, a fix rate map 604 may be generated after step 512. In the fix rate map 604, DRC violations are divided into multiple groups based on the calculated fix rate (e.g., fix rate ranging from 0 to 0.2, fix rate ranging from 0.5 to 0.8, etc.). At step 514, the importance of different features are evaluated. At step 516, the features of a new electronic device design may be compared with those of existing electronic device design in the database to determine how similar they are. Details of step 514 and 516 will be described later.

As shown in FIG. 6, an unsupervised learning (UL) kernel 602 is configured to train a machine learning model. In some embodiments, the machine learning model is a data clustering machine learning model. Data clustering is the task of dividing data points into a number of groups such that data points in the same groups are more similar to other data points in the same group and dissimilar to the data points in other groups. In a non-limiting example, the data clustering machine learning model is a density-based data clustering machine learning model. In density-based data clustering, the clusters are considered as dense region having some similarity and different from the lower dense region of the space. Density-based data clustering has good accuracy and ability to merger two clusters. In a non-limiting example, the density-based data clustering machine learning model is the Density-Based Spatial Clustering of Applications with Noise (DBSCAN) model. In another non-limiting example, the density-based data clustering machine learning model is the Ordering Points to Identify Clustering Structure (OPTICS) model. DBSCAN is a data clustering algorithm and specifically a density-based clustering non-parametric algorithm. Given a set of data points in some space, the DBSCAN model can group together data points that are closely packed together (data points with many nearby neighbors), marking as outliers data points that lie alone in low-density regions (whose nearest neighbors are too far away). The DBSCAN model has two parameters, namely ε (eps) and the minimum number of data points required to form a dense region (minPts). The DBSCAN algorithm can be abstracted into the following steps: (1) find the data points in the ε (eps) neighborhood of every data point, and identify the core data points with more than minPts neighbors; (2) find the connected components of core data points on neighbor graph, ignoring all non-core data points; and (3) assign each non-core data point to a nearby cluster if the cluster is an ε (eps) neighbor, otherwise assign it to noise.

In the training phase 520, which may be offline, training data points may be normalized at step 522. In-sample accuracy and out-of-sample accuracy may be evaluated at step 524 and step 526, respectively. For electronic device designs (specifically, electronic circuit placement layouts) used for training, there are training data points and in-sample testing data points. In other words, some of the known electronic device design data points (i.e., training data points) are used for training, and the remaining (i.e., in-sample testing data points) are used for testing the trained machine learning model. For new electronic device designs, the data points are called out-of-sample data points. Therefore, in-sample accuracy may indicate how accurately the machine learning model can predict the in-sample testing data points; out-of-sample accuracy may indicate how accurately the machine learning model can predict the out-of-sample data points. The machine learning model is officially trained at step 528.

As shown in FIG. 6, the training result 606 is projected in a two-dimensional plane. In some embodiments, the training result 606 is projected using principal component analysis (PCA). The principal components of a collection of data points in a real p-space are a sequence of p direction vectors, where the $i^{th}$ vector is the direction of a line that best fits the data while being orthogonal to the first (i−1) vectors. PCA is often used in exploratory data analysis and for making predictive models. It is commonly used for dimensionality reduction by projecting each data point onto only the first few principal components to obtain low-dimensional data while preserving as much of the data's variation as possible. After the training, the relationship between a feature combination (N-dimensional as mentioned above) and corresponding fix rate is obtained and presented in the form of the training result 606. Specifically, the fix rate can be written in the following equation: $FR=f(x_1, x_2, \ldots, x_N)$, where FR is the fix rate, and $x_1, x_2 \ldots x_N$ are the N-dimensional features.

Figure 7:
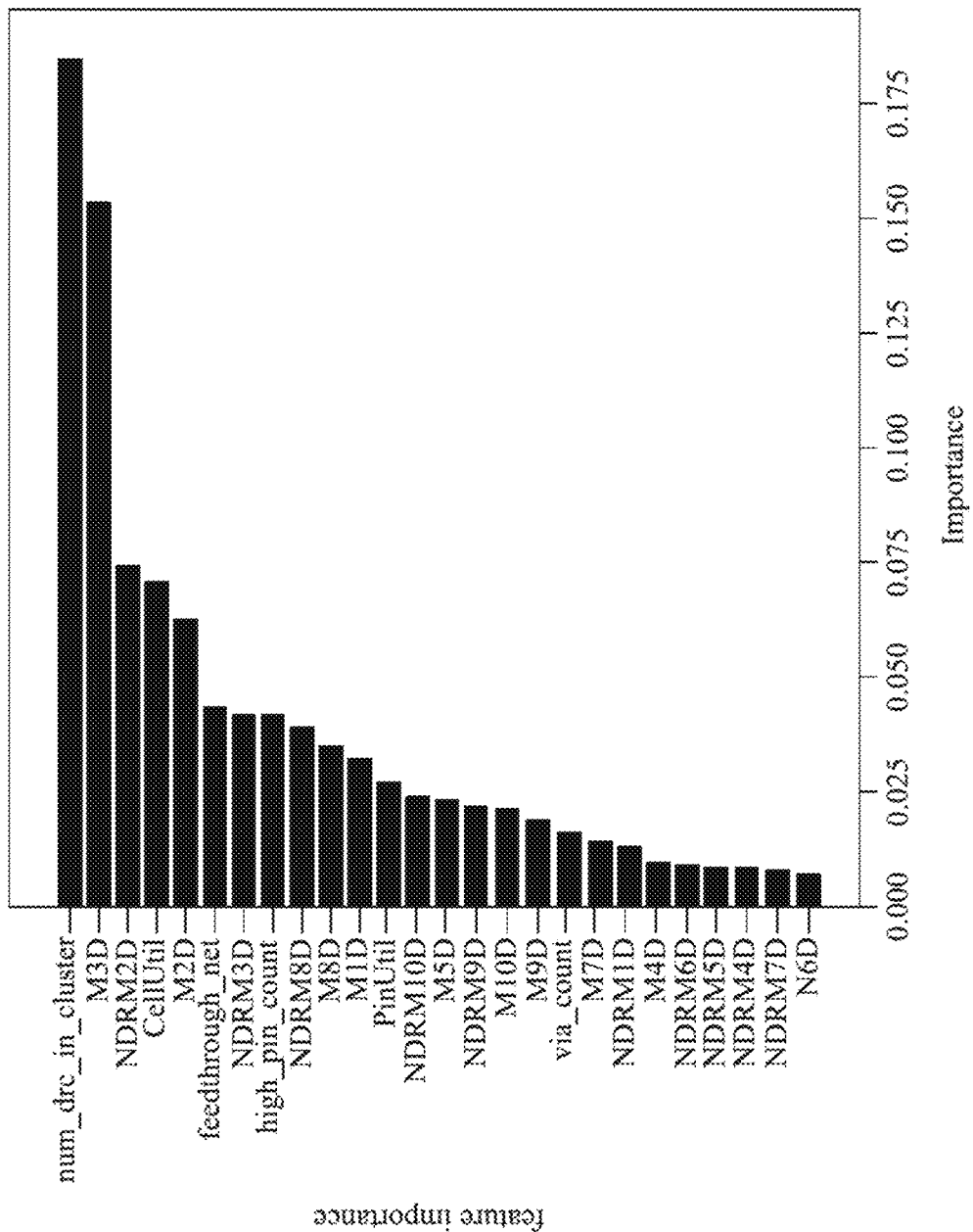
FIG. 7 is a diagram illustrating feature importance evaluation.

FIG. 7 is a diagram illustrating feature importance evaluation. Based on the training result 606, the importance of different features can be evaluated at step 514 of FIG. 5. In other words, it is determined which features among the N features are more important than others in terms of leading to an HTF DRC violation. In the example of FIG. 7, the following features have relatively more importance than others: a DRC violation count in a DRC violation cluster, Metal 3 (M3) layer density, non-default rule (NDR) aware Metal 2 (M2) layer density, a cell density, M2 layer density, a feedthrough net count, NDR aware M3 layer density, a high-pin cell count, NDR aware Metal 8 (M8) layer density, M8 layer density, Metal 1 (M1) layer density, and a pin density. It should be appreciated that these features and associated importance in FIG. 7 are just examples. Other features and associated importance are within the scope of the disclosure. The feature importance evaluation as shown in FIG. 7 may be employed as the guideline in future design to reduce HTF DRC violations.

Referring back to FIG. 5, in the inference phase 530, new data points may be normalized at step 532. At step 534, fix rates of the new data points are predicted based on the trained machine learning model. Eventually, based on the predicted fix rates, HTF DRC violations may be predicted at step 536. In one embodiment, the predicted fix rates are compared with a threshold fix rate (e.g., 50%). When the predicted fix rates are below the threshold fix rate, those associated DRC violations are determined to be HTF DRC violations. Details of steps 532, 534, and 536 will be described in detail below.

As shown in FIG. 6, the training result 606 includes multiple clusters. Data points in one cluster are close to each other in the N-dimensional space, meaning that the feature combinations are similar to each other. For instance, as schematically illustrated in FIG. 6, a new data point 610 (corresponding to a DRC violation 204 in a new electronic device design) is close to two neighboring clusters 608a and 608b in the N-dimensional space. Specifically, the "feature distance" between the DRC violation 204 to every neighboring clusters, i.e., the Euclidean distance among all features with respect to cluster features, are calculated. In the example of FIG. 6, the distance to the cluster 608a is $d_1$ and the cluster 608a has a fix rate higher than 0.8; the distance to the cluster 608b is $d_2$ and the cluster 608b has a fix rate lower than 0.2. If $d_1$ is smaller than $d_2$, then the new data point 610 (i.e., the DRC violation 204) is more similar to the cluster 608a, and the predicted fix rate of the new data point (i.e., the DRC violation 204) is relatively high. If $d_2$ is smaller than $d_1$, then the new data point 610 (i.e., the DRC violation 204) is more similar to the cluster 608b, and the predicted fix rate of the new data point (i.e., the DRC violation 204) is relatively low. It should be appreciated that the neighboring clusters 608a and 608b are exemplary, and other numbers of neighboring clusters are within the scope of the disclosure.

Figure 8B:
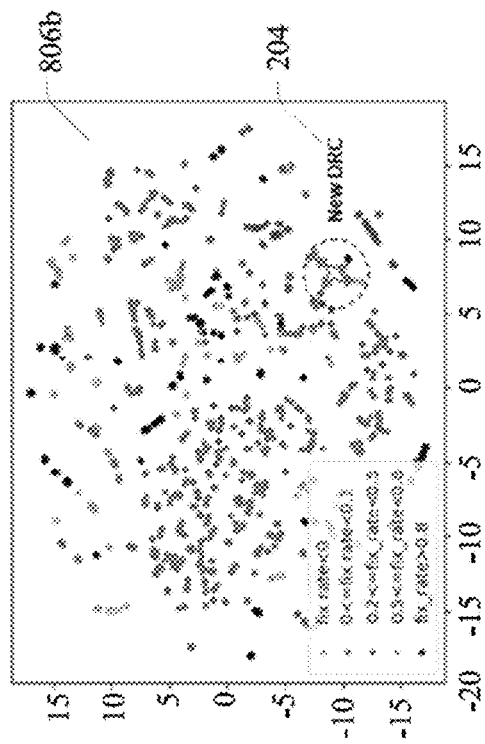
FIG. 8B is a diagram illustrating a new data utilization with normalization in accordance with some embodiments.
Figure 8A:
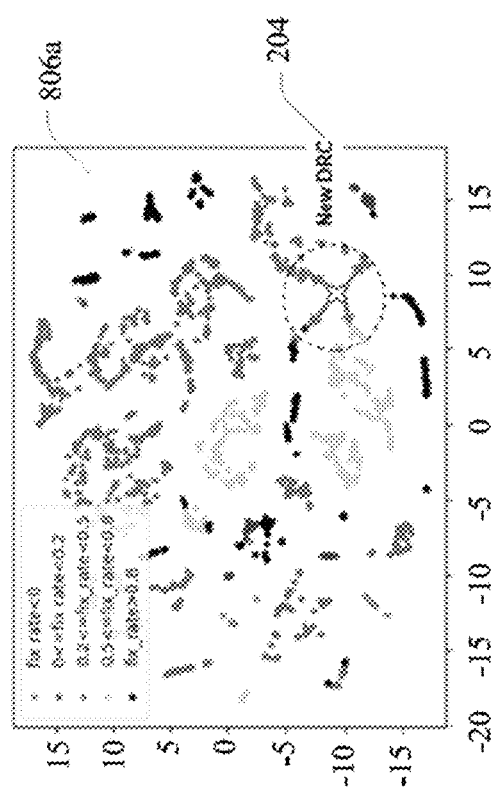
FIG. 8A is a diagram illustrating a new data utilization without normalization in accordance with some embodiments.

FIG. 8A is a diagram illustrating a new data utilization without normalization in accordance with some embodiments. FIG. 8B is a diagram illustrating a new data utilization with normalization in accordance with some embodiments. In general, the accuracy of HTF violation prediction may be boosted with normalization. As shown in the trained result 806a without normalization in FIG. 8A where clusters are separated, a new DRC violation 204 may be far from all existing clusters. As a result, it is not easy to find any appropriate neighboring clusters for the new DRC violation 204 to predict the fix rate. In other words, the prediction has a low confidence. In contrast, as shown in the trained result 806b with normalization in FIG. 8B where clusters are evenly distributed, the same new DRC violation 204 may be closer to those existing clusters. As a result, it becomes easier to find the closest cluster for the new DRC violation 204 to predict the fix rate. In other words, the prediction has a higher confidence. In some embodiments, a feature $x_i$ is normalized in accordance with the following equation: $x_i' = (x_1 - x_{i,min})/(x_{i,max} - x_{i,min})$, where $x_i'$ is the normalized value of the feature, $x_{i,min}$ is the minimum value of the feature, and $x_{i,max}$ is the maximum value of the feature. In some embodiments, the average out-of-sample accuracy could be about 80% after using normalization.

Figure 9:
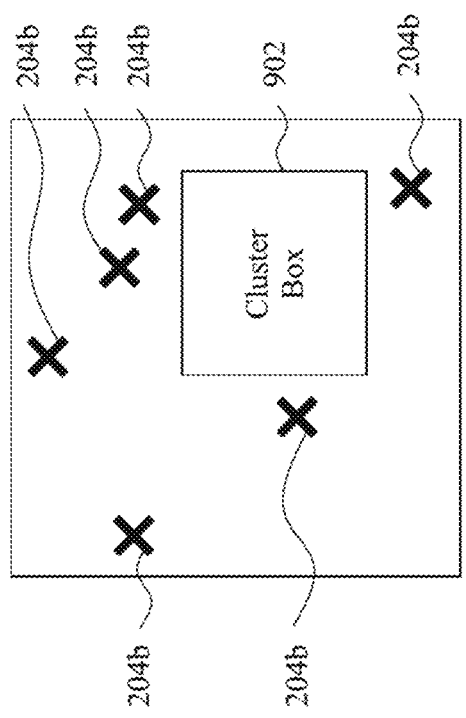
FIG. 9 is a diagram illustrating scatter DRC violations in accordance with some embodiments.
Figure 10:
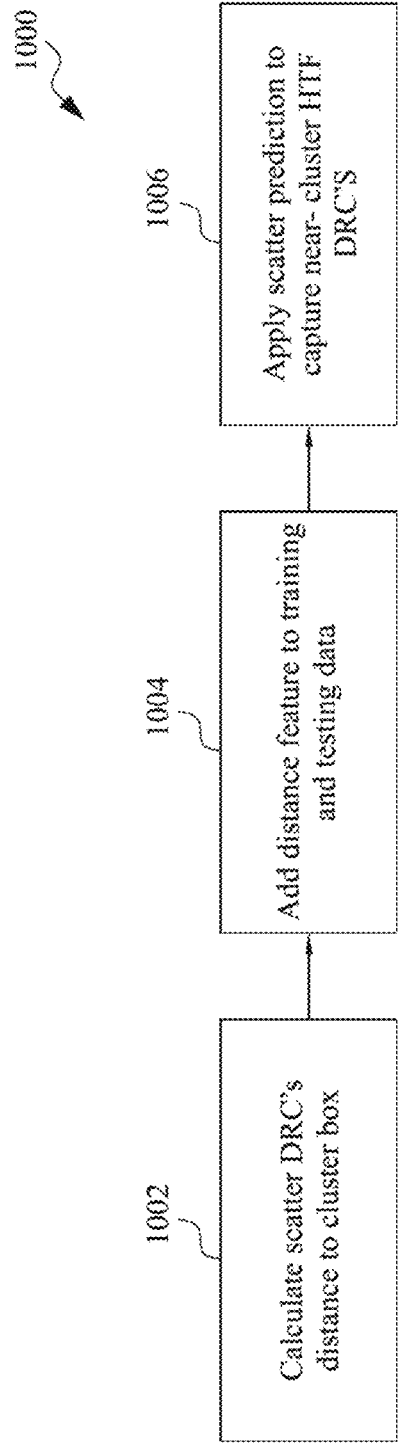
FIG. 10 is a flowchart illustrating a method for predicting scatter DRC violations to be HTF DRC violations in accordance with some embodiments.
Figure 11:
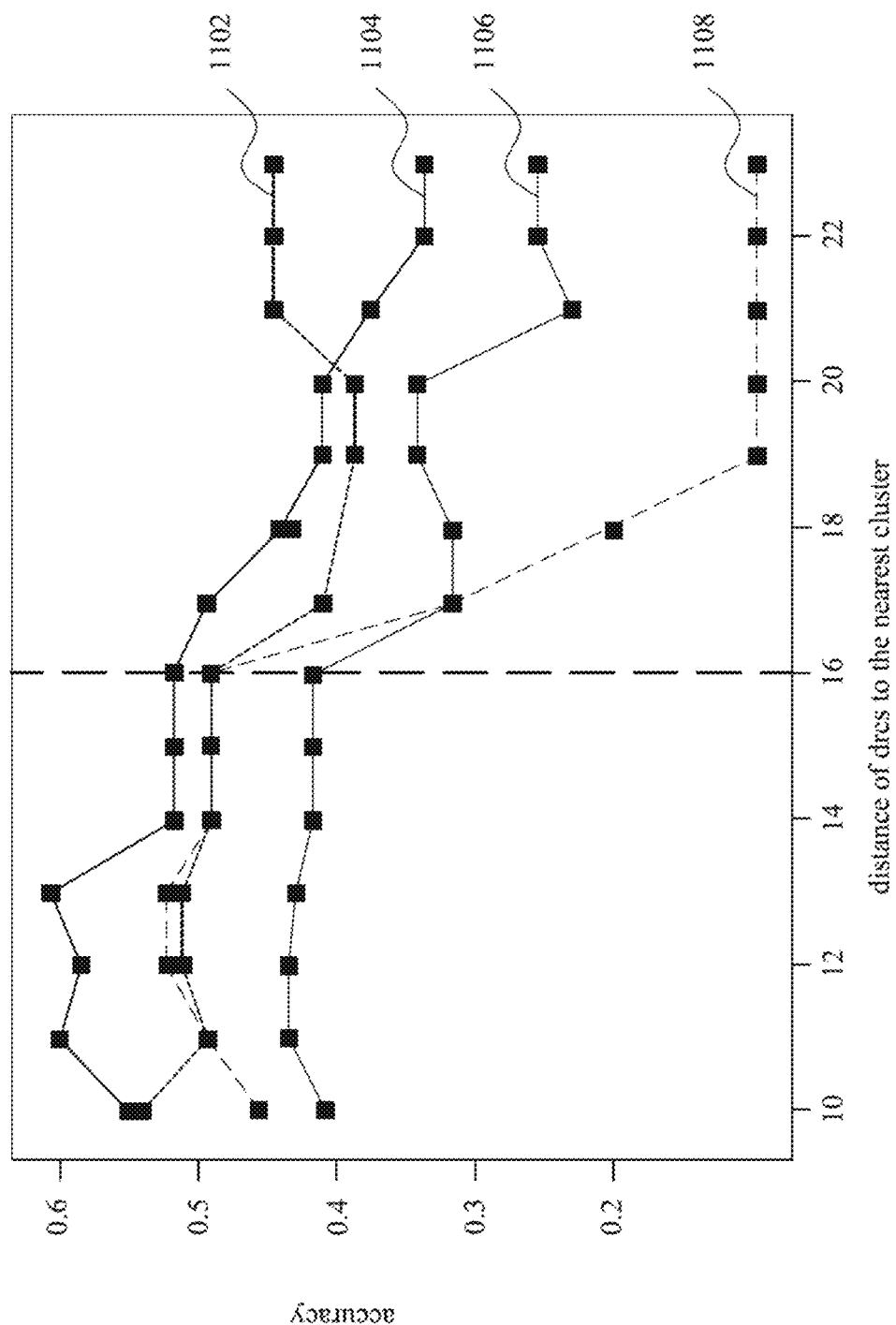
FIG. 11 is a diagram illustrating the relationship between accuracy and clustering threshold in accordance with some embodiments.

FIG. 9 is a diagram illustrating scatter DRC violations 204b in accordance with some embodiments. FIG. 10 is a flowchart illustrating a method 100 for predicting scatter DRC violations to be HTF DRC violations in accordance with some embodiments. FIG. 11 is a diagram illustrating the relationship between accuracy and clustering threshold in accordance with some embodiments. As shown in the example of FIG. 9, scatter DRC violations 204b may be located around a cluster box 902 which has many cluster DRC violations inside it. As shown in FIG. 11, the prediction accuracy becomes lower when the distance of a scatter DRC violation 204b to the cluster box 902 gets larger. For different electronic device designs 1102, 1104, 1106, and 1108, the accuracy drops considerably when the distance is larger than 16 μm. In other words, 16 μm is a clustering threshold in this example of FIG. 11. Due to the existence of the clustering threshold, if a designer defines, according to his experience, a scatter DRC violation 204b to be an HTF DRC violation simply based on a fixed distance to the cluster box 902, the choice of the fixed distance might be arbitrary. For two scatter DRC violations 204b with similar distances to the cluster box 902, one might be treated as an HTF DRC violation and the other might not be treated as an HTF DRC violation.

Therefore, the method 1000 may improve the prediction accuracy of HTF scatter DRC violations. At step 1002, the distances of scatter DRC violations 204b to the cluster box 902 are calculated. At step 1004, the distances are treated as one of the multiple features and used in training and testing of the machine learning model. At step 1006, predict whether a new scatter DRC violation is an HTF DRC violation based on the trained machine learning model, to capture near-cluster-box HTF scatter DRC violations. In other words, no fixed distance is used in the method 1000. Instead, the distance is treated as one feature for training and testing the machine learning model. As a result, near-cluster-box HTF scatter DRC violations may be captured with a higher accuracy, and the prediction may be more consistent among different electronic device designs.

Figure 12:
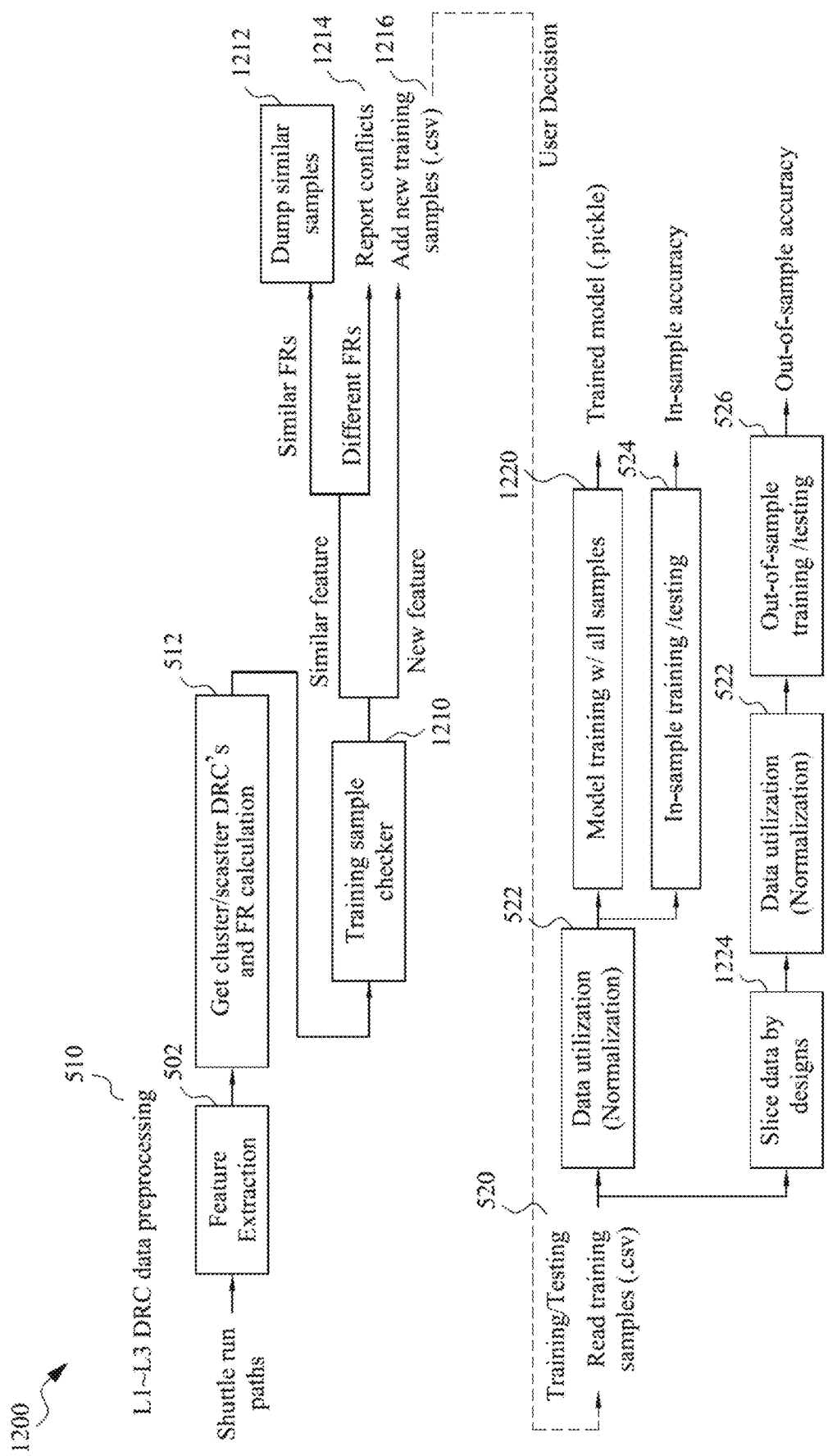
FIG. 12 is a flowchart illustrating a method for HTF DRC violation prediction in accordance with some embodiments.

FIG. 12 is a flowchart illustrating a method 1200 for HTF DRC violation prediction in accordance with some embodiments. Aspects that are similar to those in FIG. 5 will not be described in detail for simplicity. In the preprocessing phase 510, data points of L1-L3 DRC violations are preprocessed. As mentioned above, feature combinations of many electronic device designs are extracted at step 502, and fix rates are calculated for DRC violations at step 512, based on the feature extraction at step 502. At step 1210, new training data points are checked. Specifically, when the feature combination of a new training data point is similar to an existing feature combination and the fix rate is similar (i.e., the different is below a threshold percentage like, for example, 5% or 10%) to the fix rate of that existing feature combination, the new training data point is dumped at step 1212 as it can be regarded as a similar sample. When the feature combination of a new training data point is similar to an existing feature combination and the fix rate is not similar (i.e., the different is equal to or above a threshold percentage like, for example, 5% or 10%) to the fix rate of that existing feature combination, conflicts are reported at 1214. When the feature combination of a new training data point is not similar to any existing feature combinations, the new training data point is added into the machine learning model as a new sample. In some embodiments, the samples are in the format of CSV (comma-separated values) file. As such, different new training data points may be treated differently depending on feature similarity and fix rate similarity.

Then in the training phase 520, all training samples are used for training. At step 522, data points are normalized. At step 1220, all data points are used to train the machine learning model, to generate a trained machine learning model. At step 524, in-sample accuracy is evaluated using in-sample training and testing. On the other hand, for out-of-sample data points, data points are sliced based on different designs first at step 1224. Then at step 522, data points are normalized. Then at step 526, out-of-sample accuracy is evaluated using out-of-sample training and testing.

Figure 13C:
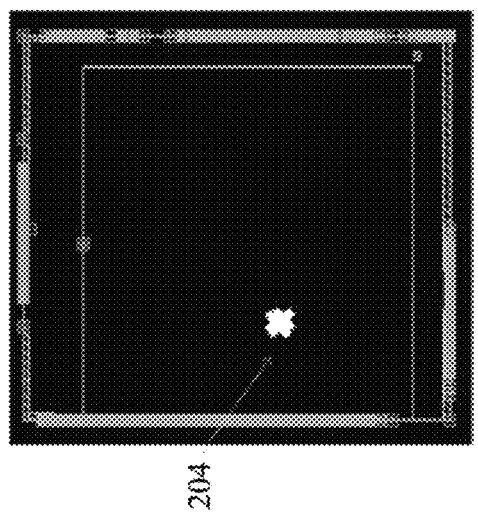
FIG. 13C us a diagram illustrating the DRC violations of FIG. 13A after ADF in accordance with some embodiments.
Figure 13B:
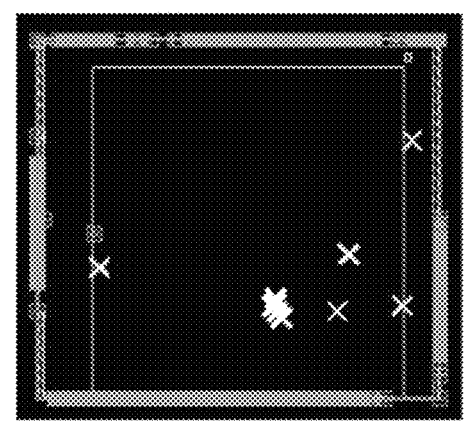
FIG. 13B is a diagram illustrating the DRC violations of FIG. 13A before ADF in accordance with some embodiments.
Figure 13A:
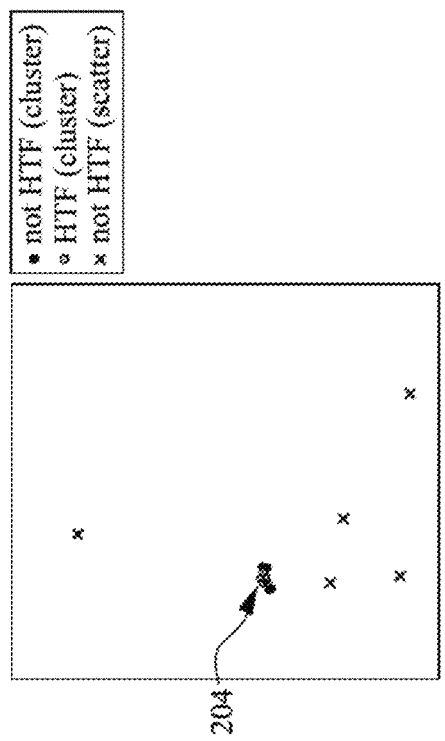
FIG. 13A is a diagram illustrating HTF DRC violations predicted by the HTF DRC violation prediction platform of FIG. 1 in accordance with some embodiments.

FIG. 13A is a diagram illustrating HTF DRC violations predicted by the HTF DRC violation prediction platform 32 of FIG. 1 in accordance with some embodiments. FIG. 13B is a diagram illustrating the DRC violations of FIG. 13A before ADF in accordance with some embodiments. FIG. 13C us a diagram illustrating the DRC violations of FIG. 13A after ADF in accordance with some embodiments. As shown in FIG. 13A, there are many DRC violations in the design and some of them (204 as shown in FIG. 13A) are predicted as HTF DRC violations. After ADF, the predicted HTF DRC violations remain unfixed while other HTF DRC violations are fixed.

Figure 14C:
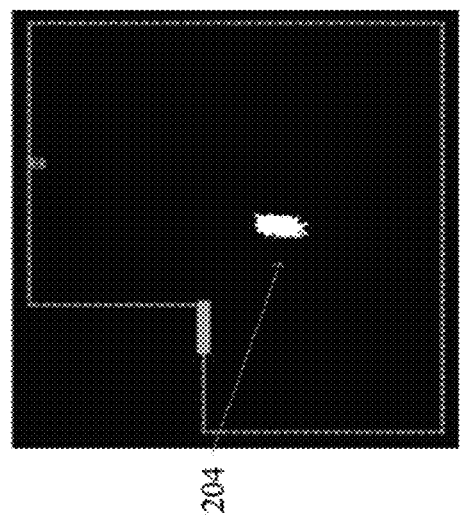
FIG. 14C us a diagram illustrating the DRC violations of FIG. 13A after ADF in accordance with some embodiments.
Figure 14B:
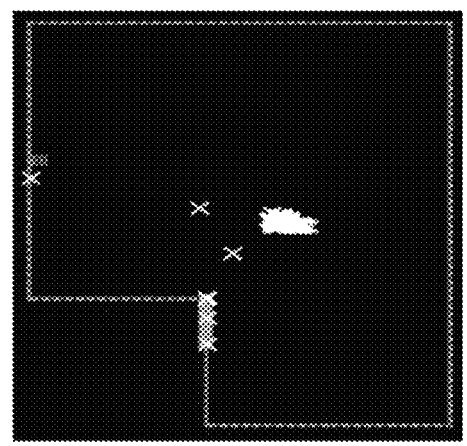
FIG. 14B is a diagram illustrating the DRC violations of FIG. 13A before ADF in accordance with some embodiments.
Figure 14A:
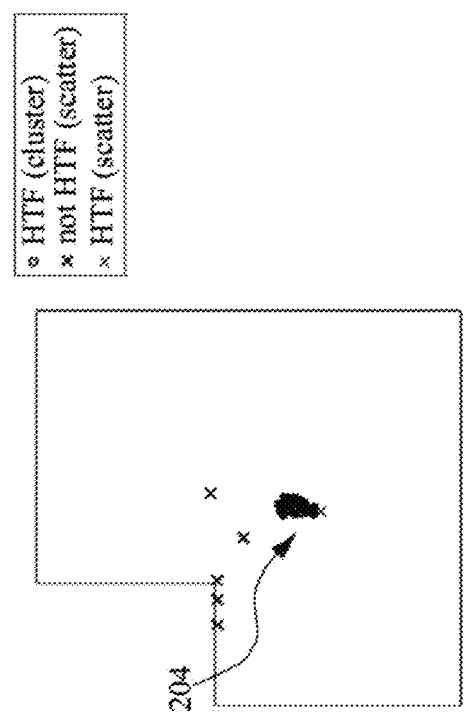
FIG. 14A is a diagram illustrating HTF DRC violations predicted by the HTF DRC violation prediction platform of FIG. 1 in accordance with some embodiments.

FIG. 14A is a diagram illustrating HTF DRC violations predicted by the HTF DRC violation prediction platform 32 of FIG. 1 in accordance with some embodiments. FIG. 14B is a diagram illustrating the DRC violations of FIG. 13A before ADF in accordance with some embodiments. FIG. 14C us a diagram illustrating the DRC violations of FIG.

13A after ADF in accordance with some embodiments. As shown in FIG. 14A, there are many DRC violations in the design and some of them (204 as shown in FIG. 14A) are predicted as HTF DRC violations. After ADF, the predicted HTF DRC violations remain unfixed while other HTF DRC violations are fixed. It should be noted that FIGS. 13A-C and 14A-C are two examples. Other electronic device designs have been used for HTF DRC violation prediction, and the average in-sample accuracy is around 93% while the out-of-sample accuracy for cluster DRC violations and scatter DRC violations is around 70% and has a larger deviation than the in-sample accuracy.

Figure 15B:
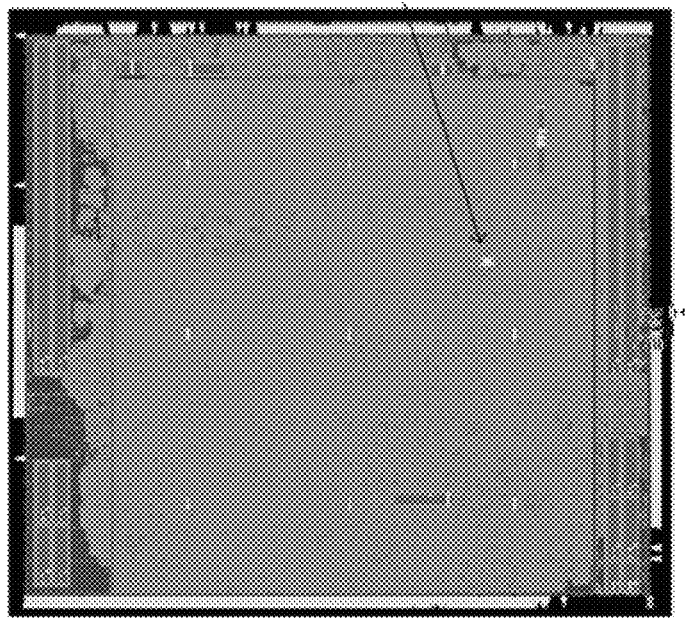
FIG. 15B is a diagram illustrating newly classified L3 DRC violations by the HTF DRC violation prediction platform of FIG. 1 in accordance with some embodiments.
Figure 15A:
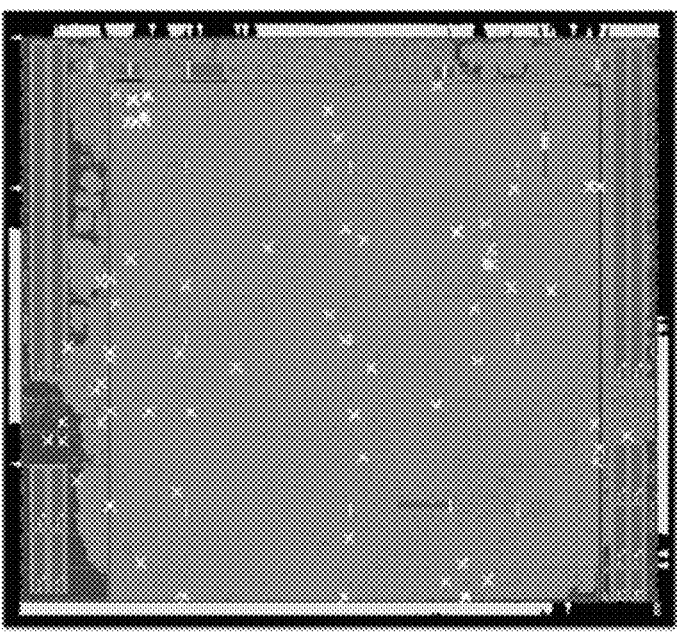
FIG. 15A is a diagram illustrating L1 DRC violations, L2 DRC violations, and L3 DRC violations of an electronic device design in accordance with some embodiments.
Figure 15C:
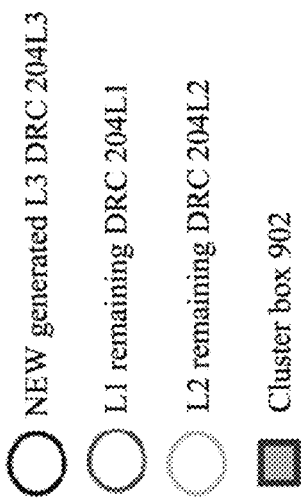
FIG. 15C is a diagram illustrating all DRC violations after ADF in accordance with some embodiments.
Figure 15C:
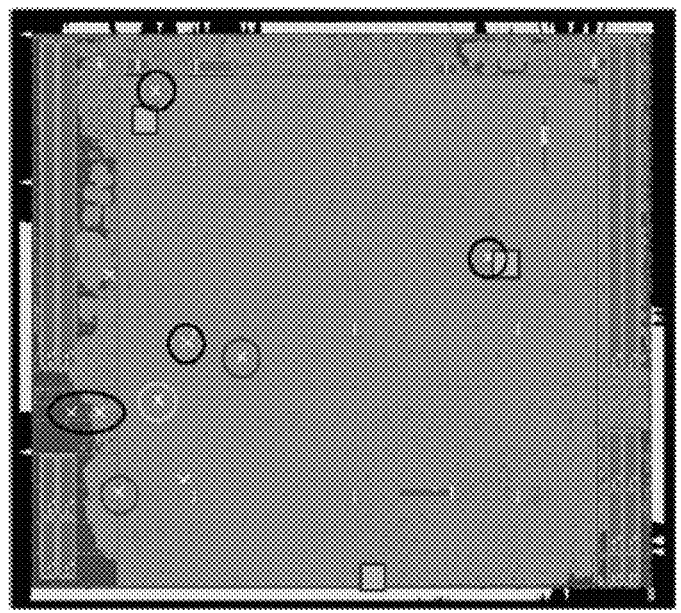

FIG. 15A is a diagram illustrating L1 DRC violations, L2 DRC violations, and L3 DRC violations of an electronic device design in accordance with some embodiments. FIG. 15B is a diagram illustrating newly classified L3 DRC violations by the HTF DRC violation prediction platform 32 of FIG. 1 in accordance with some embodiments. FIG. 15C is a diagram illustrating all DRC violations after ADF in accordance with some embodiments. As shown in FIG. 15A, there are L1 DRC violations, L2 DRC violations, and L3 DRC violations located in the electronic device design. After the HTF DRC violation prediction performed by the HTF DRC violation prediction platform 32 of FIG. 1, twenty-three newly classified L3 DRC violations (shown as 204 in FIG. 15B) are identified. In other words, these twenty-three newly classified L3 DRC violations would have been classified as L1 or L2 DRC violations but for the HTF DRC violation prediction. As a result, the ECO tool 34 may avoid multiple attempts to fix those twenty-three newly classified L3 DRC violations. As shown in FIG. 15C, after ADF, many L1 and L2 DRC violations have been fixed, but some L1 and L2 DRC violations (shown as 204L1 and 204L2 in FIG. 15C) are remaining. In the meantime, cluster boxes 902 are identified and newly generated L3 DRC violations are identified.

Figure 16:
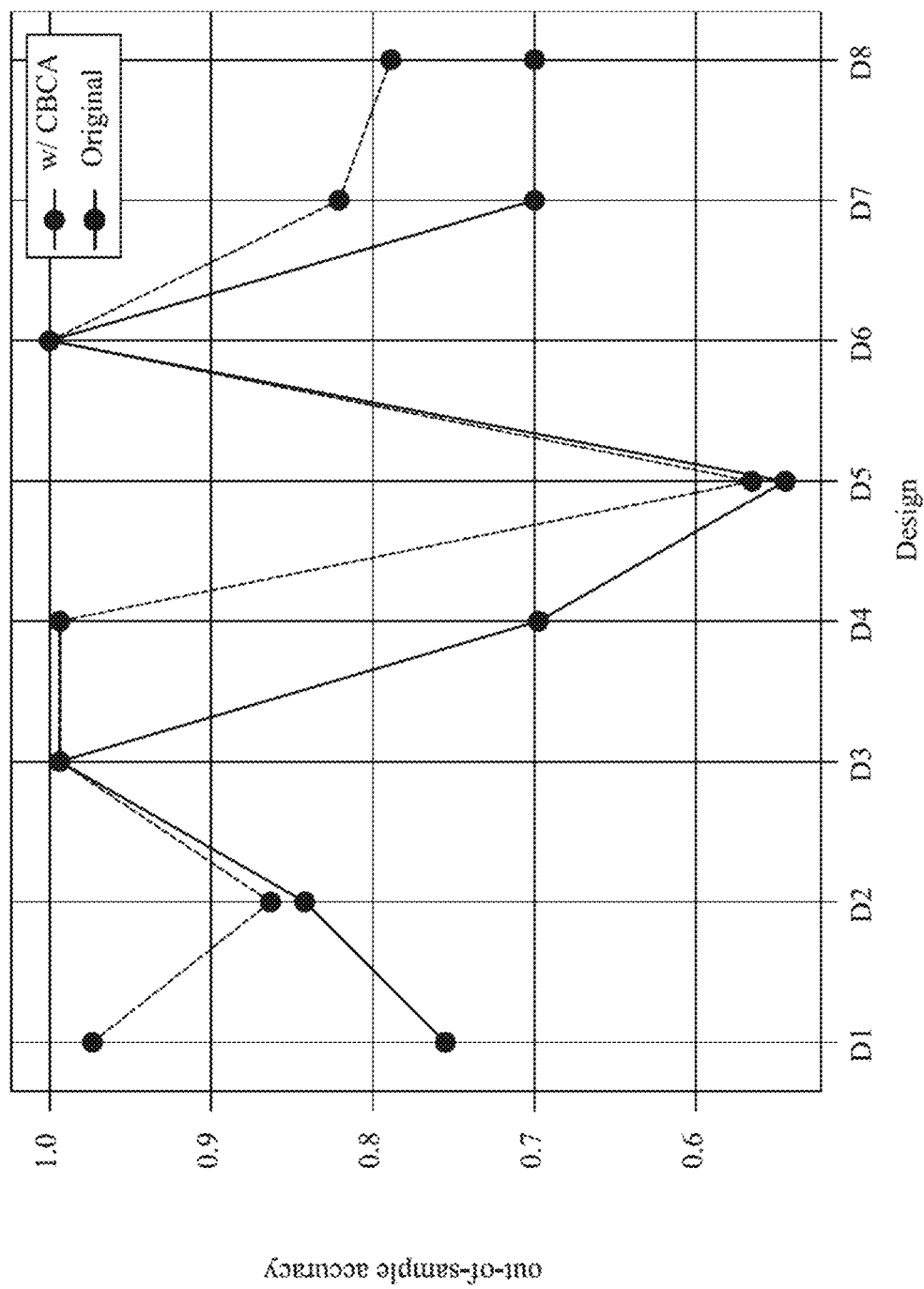
FIG. 16 is a diagram illustrating Out-of-sample accuracy improvement with growing training samples in accordance with some embodiments.

FIG. 16 is a diagram illustrating Out-of-sample accuracy improvement with growing training samples in accordance with some embodiments. As mentioned above, out-of-sample accuracy is generally lower than in-sample accuracy. Due to the nature of the machine learning model, out-of-sample accuracy may be improved with growing training samples. As shown in FIG. 16, for eight different designs D1-D8, out-of-sample accuracy is improved by 9.6% on average after adding a new group of samples called "CBCA."

In summary, the electronic device design system 10 of FIG. 1 includes the HTF DRC violation prediction platform 32 of FIG. 1. DRC violations are classified as L1-L4 DRC violations more precisely based on the HTF DRC violation prediction using AI and ML techniques, to facilitate the fix process of DRC violations without spending redundant fix iterations. HTF DRC violation prediction platform 32 of FIG. 1 may achieve an in-sample accuracy of about 93% and an out-of-sample accuracy of about 70%.

FIG. 17 is a block diagram of a computer system 1700 in accordance with some embodiments. One or more of the tools and/or systems and/or operations described with respect to FIGS. 1-16 are realized in some embodiments by one or more computer systems 1700 of FIG. 17. The system 1700 comprises a processor 1701, a memory 1702, a network interface (I/F) 1706, a storage 1710, an input/output (I/O) device 1708, and one or more hardware components 1718 communicatively coupled via a bus 1704 or other interconnection communication mechanism.

The memory 1702 includes, in some embodiments, a random access memory (RAM) and/or other dynamic storage device and/or read only memory (ROM) and/or other static storage device, coupled to the bus 1704 for storing data and/or (processing) instructions to be executed by the processor 1701, e.g., kernel 1714, userspace 1716, portions of the kernel and/or the userspace, and components thereof. The memory 1702 is also used, in some embodiments, for storing temporary variables or other intermediate information during execution of instructions to be executed by the processor 1701.

In some embodiments, a storage device 1710, such as a magnetic disk or optical disk, is coupled to the bus 1704 for storing data and/or instructions, e.g., kernel 1714, userspace 1716, etc. The I/O device 1708 comprises an input device, an output device and/or a combined input/output device for enabling user interaction with the system 1700. An input device comprises, for example, a keyboard, keypad, mouse, trackball, trackpad, and/or cursor direction keys for communicating information and commands to the processor 1701. An output device comprises, for example, a display, a printer, a voice synthesizer, etc. for communicating information to a user.

In some embodiments, one or more operations and/or functionality of the tools and/or systems described with respect to FIGS. 1-16 are realized by the processor 1701, which is programmed for performing such operations and/or functionality. One or more of the memory 1702, the I/F 1706, the storage 1710, the I/O device 1708, the hardware components 1718, and the bus 1704 are operable to receive instructions, data, design rules, netlists, layouts, models and/or other parameters for processing by the processor 1701.

In some embodiments, one or more of the operations and/or functionality of the tools and/or systems described with respect to FIGS. 1-16 are implemented by specifically configured hardware (e.g., by one or more application specific integrated circuits or ASIC(s)) which are included) separate from or in lieu of the processor 1701. Some embodiments incorporate more than one of the described operations and/or functionality in a single ASIC.

In some embodiments, the operations and/or functionality are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, or other suitable non-transitory computer readable recording medium.

The computer system 1700 may further include fabrication tools 1750 for implementing the processes and/or methods stored in the storage 1710. For instance, a synthesis may be performed on a design in which the behavior and/or functions desired from the design are transformed to a functionally equivalent logic gate-level circuit description by matching the design to standard cells selected from a layout unit library. The synthesis results in a functionally equivalent logic gate-level circuit description, such as a gate-level netlist. Based on the gate-level netlist, a photolithographic mask may be generated that is used to fabricate the integrated circuit by the fabrication tools 1750. Further aspects of device fabrication are disclosed in conjunction with FIG. 18, which is a block diagram of IC manufacturing system 1800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using the manufacturing system 1800.

Figure 18:
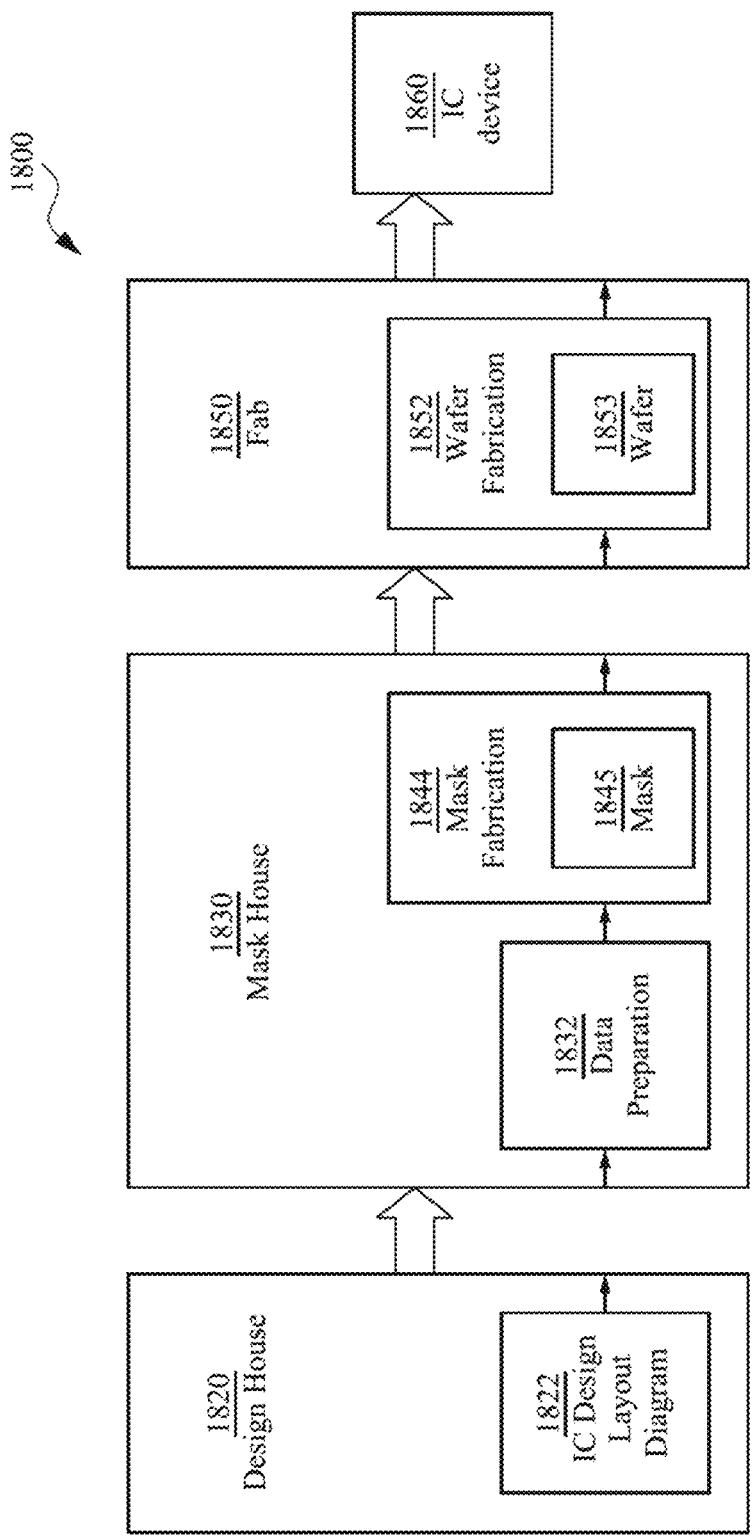
FIG. 18 is a block diagram of IC manufacturing system in accordance with some embodiments.

FIG. 18 is a block diagram of IC manufacturing system in accordance with some embodiments. In FIG. 18, the IC manufacturing system 1800 includes entities, such as a design house 1820, a mask house 1830, and an IC manufacturer/fabricator ("fab") 1850, that interact with one another in the design, development, and manufacturing cycles and/or services related to manufacturing an IC device 1860. The entities in the system 1800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 1820, mask house 1830, and IC fab 1850 is owned by a single larger company. In some embodiments, two or more of design house 1820, mask house 1830, and IC fab 1850 coexist in a common facility and use common resources.

The design house (or design team) 1820 generates an IC design layout diagram 1822. The IC design layout diagram 1822 includes various geometrical patterns, or IC layout diagrams designed for an IC device 1860. The geometrical patterns correspond to patterns of metal, oxide, or semiconductor layers that make up the various components of IC device 1860 to be fabricated. The various layers combine to form various IC features. For example, a portion of the IC design layout diagram 1822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 1820 implements a design procedure to form an IC design layout diagram 1822. The design procedure includes one or more of logic design, physical design or place and route. The IC design layout diagram 1822 is presented in one or more data files having information of the geometrical patterns. For example, IC design layout diagram 1822 can be expressed in a GDSII file format or DFII file format.

The mask house 1830 includes a data preparation 1832 and a mask fabrication 1844. The mask house 1830 uses the IC design layout diagram 1822 to manufacture one or more masks 1845 to be used for fabricating the various layers of the IC device 1860 according to the IC design layout diagram 1822. The mask house 1830 performs mask data preparation 1832, where the IC design layout diagram 1822 is translated into a representative data file ("RDF"). The mask data preparation 1832 provides the RDF to the mask fabrication 1844. The mask fabrication 1844 includes a mask writer. A mask writer converts the RDF to an image on a substrate, such as a mask (reticle) 1845 or a semiconductor wafer 1853. The design layout diagram 1822 is manipulated by the mask data preparation 1832 to comply with particular characteristics of the mask writer and/or requirements of the IC fab 1850. In FIG. 18, the mask data preparation 1832 and the mask fabrication 1844 are illustrated as separate elements. In some embodiments, the mask data preparation 1832 and the mask fabrication 1844 can be collectively referred to as a mask data preparation.

In some embodiments, the mask data preparation 1832 includes an optical proximity correction (OPC) which uses lithography enhancement techniques to compensate for image errors, such as those that can arise from diffraction, interference, other process effects and the like. The OPC adjusts the IC design layout diagram 1822. In some embodiments, the mask data preparation 1832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1832 includes a mask rule checker (MRC) that checks the IC design layout diagram 1822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1822 to compensate for limitations during the mask fabrication 1844, which may undo part of the modifications performed by OPC in order to meet mask creation rules.

In some embodiments, the mask data preparation 1832 includes lithography process checking (LPC) that simulates processing that will be implemented by the IC fab 1850 to fabricate the IC device 1860. LPC simulates this processing based on the IC design layout diagram 1822 to create a simulated manufactured device, such as the IC device 1860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules. OPC and/or MRC are be repeated to further refine the IC design layout diagram 1822.

It should be understood that the above description of mask data preparation 1832 has been simplified for the purposes of clarity. In some embodiments, data preparation 1832 includes additional features such as a logic operation (LOP) to modify the IC design layout diagram 1822 according to manufacturing rules. Additionally, the processes applied to the IC design layout diagram 1822 during data preparation 1832 may be executed in a variety of different orders.

After the mask data preparation 1832 and during the mask fabrication 1844, a mask 1845 or a group of masks 1845 are fabricated based on the modified IC design layout diagram 1822. In some embodiments, the mask fabrication 1844 includes performing one or more lithographic exposures based on the IC design layout diagram 1822. In some embodiments, an electron-beam (e-beam) or a mechanism of multiple e-beams is used to form a pattern on a mask (photomask or reticle) 1845 based on the modified IC design layout diagram 1822. The mask 1845 can be formed in various technologies. In some embodiments, the mask 1845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask 1845 includes a transparent substrate (e.g., fused quartz) and an opaque material (e.g., chromium) coated in the opaque regions of the binary mask. In another example, the mask 1845 is formed using a phase shift technology. In a phase shift mask (PSM) version of the mask 1845, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 1844 is used in a variety of processes. For example, such a mask(s) is used in an ion implantation process to form various doped regions in the semiconductor wafer 1853, in an etching process to form various etching regions in the semiconductor wafer 1853, and/or in other suitable processes.

The IC fab 1850 includes wafer fabrication 1852. The IC fab 1850 is an IC fabrication business that includes one or more manufacturing facilities for the fabrication of a variety of different IC products. In some embodiments, the IC Fab 1850 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1850 uses mask(s) 1845 fabricated by the mask house 1830 to fabricate the IC device 1860. Thus, the IC fab 1850 at least indirectly uses the IC design layout diagram 1822 to fabricate the IC device 1860. In some embodiments, the semiconductor wafer 1853 is fabricated by the IC fab 1850 using mask(s) 1845 to form the IC device 1860. In some embodiments, the IC fabrication includes performing one or more lithographic exposures based at least indirectly on the IC design layout diagram 1822. The Semiconductor wafer 1853 includes a silicon substrate or other proper substrate having material layers formed thereon. The semiconductor wafer 1853 further includes one or more of various doped regions, dielectric features, multilevel interconnects, and the like (formed at subsequent manufacturing steps).

In accordance with some disclosed embodiments, a method is provided. The method includes: training a machine learning model with a plurality of electronic circuit placement layouts; predicting, by the machine learning model, fix rates of design rule check (DRC) violations of a new electronic circuit placement layout; identifying hard-to-fix (HTF) DRC violations among the DRC violations based on the fix rates of the DRC violations of the new electronic circuit placement layout; and fixing, by an engineering change order (ECO) tool, the DRC violations.

In accordance with some disclosed embodiments, a method is provided. The method includes: training a machine learning model with a plurality of electronic circuit placement layouts, the machine learning model being configured to predict hard-to-fix (HTF) design rule check (DRC) violations, information of the plurality of electronic circuit placement layouts being stored in a database; extracting a feature combination of a new electronic circuit placement layout; calculating fix rates of DRC violations present on the new electronic circuit placement layout; comparing the feature combination with existing feature combinations corresponding to the plurality of electronic circuit placement layouts; and adding information of the new electronic circuit placement layout to the database when the feature combination is new.

In accordance with further disclosed embodiments, a system is provided. The system includes a hard-to-fix (HTF) design rule check (DRC) violation prediction platform and an engineering change order (ECO) tool. The hard-to-fix (HTF) design rule check (DRC) violation prediction platform includes a memory and a processor. The memory is configured to store data and processing instructions. The processor is configured to execute the processing instructions to cause the HTF DRC violation prediction platform to: train a machine learning model with a plurality of electronic circuit placement layouts; predict, by the machine learning model, fix rates of DRC violations of a new electronic circuit placement layout; and identify HTF DRC violations based on the fix rates of the DRC violations of the new electronic circuit placement layout. The ECO tool is configured to fix the HTF DRC violations.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   training a machine learning model with a plurality of electronic circuit placement layouts;
   predicting, by the machine learning model, fix rates of design rule check (DRC) violations of a new electronic circuit placement layout;
   identifying hard-to-fix (HTF) DRC violations among the DRC violations based on the fix rates of the DRC violations of the new electronic circuit placement layout; and
   fixing, by an engineering change order (ECO) tool, the DRC violations,
   wherein identifying the HTF DRC violations based on the fix rates of the DRC violations of the new electronic circuit placement layout comprises:
      comparing the fix rates of the DRC violations of the new electronic circuit placement layout to a threshold fix rate; and
      determining that the fix rates of the DRC violations of the new electronic circuit placement layout are HTF DRC violations, when the fix rates of the DRC violations of the new electronic circuit placement layout are below the threshold fix rate.

2. The method of claim 1, wherein the machine learning model is a data clustering machine learning model.

3. The method of claim 2, wherein the data clustering machine learning model is a Density-Based Spatial Clustering of Applications with Noise (DBSCAN) model.

4. The method of claim 1, wherein training the machine learning model comprises:
   extracting a plurality of feature combinations of the plurality of electronic circuit placement layouts;
   calculating fix rates of DRC violations present on the plurality of electronic circuit placement layouts; and
   establishing a relationship between the fix rates and the plurality of feature combinations.

5. The method of claim 4, wherein each of the feature combinations comprises a DRC violation count in a DRC violation cluster.

6. The method of claim 4, wherein each of the feature combinations comprises a distance between a scatter DRC violation and a DRC violation cluster box.

7. The method of claim 4, wherein each of the feature combinations comprises at least one of: metal layer densities of the first ten metal layers; non-default rule (NDR) aware metal layer densities of the first ten metal layers; a cell density; a pin density; a high-pin cell count; a feedthrough net count; and a vertical interconnect access (via) count.

8. The method of claim 4, wherein training the machine learning model further comprises:
normalizing the plurality of feature combinations of the plurality of electronic circuit placement layouts.

9. The method of claim 4, wherein predicting the fix rates of the DRC violations of the new electronic circuit placement layout comprising:
extracting a feature combination of the new electronic circuit placement layout; and
predicting the fix rates of the DRC violations based on the feature combination of the new electronic circuit placement layout and the established relationship between the fix rates and the plurality of feature combinations.

10. The method of claim 9, wherein predicting the fix rates of the DRC violations of the new electronic circuit placement layout further comprising:
normalizing the feature combination of the new electronic circuit placement layout.

11. A method, comprising:
training a machine learning model with a plurality of electronic circuit placement layouts, the machine learning model being configured to predict hard-to-fix (HTF) design rule check (DRC) violations, information of the plurality of electronic circuit placement layouts being stored in a database, wherein training the machine learning model comprises:
extracting a plurality of feature combinations of the plurality of electronic circuit placement layouts;
calculating fix rates of DRC violations present on the plurality of electronic circuit placement layouts;
establishing a relationship between the fix rates and the plurality of feature combinations; and
normalizing the plurality of feature combinations of the plurality of electronic circuit placement layouts; and
extracting a feature combination of a new electronic circuit placement layout;
calculating fix rates of DRC violations present on the new electronic circuit placement layout;
comparing the feature combination with existing feature combinations corresponding to the plurality of electronic circuit placement layouts; and
adding information of the new electronic circuit placement layout to the database when the feature combination is new.

12. The method of claim 11, further comprising:
if the feature combination is one of the existing feature combinations, then comparing the fix rates with existing fix rates.

13. The method of claim 12, further comprising:
if the fix rates are similar to the existing fix rates, then dumping the information of the new electronic circuit placement layout; and
if the fix rates are not similar to the existing fix rates, then reporting a conflict notification.

14. The method of claim 11, wherein the machine learning model is a data clustering machine learning model.

15. The method of claim 14, wherein the data clustering machine learning model is a Density-Based Spatial Clustering of Applications with Noise (DBSCAN) model.

16. A system, comprising:
a hard-to-fix (HTF) design rule check (DRC) violation prediction platform comprising a memory and a processor, wherein the memory is configured to store data and processing instructions, and wherein the processor is configured to execute the processing instructions to cause the HTF DRC violation prediction platform to:
train a machine learning model with a plurality of electronic circuit placement layouts;
predict, by the machine learning model, fix rates of DRC violations of a new electronic circuit placement layout; and
identify HTF DRC violations based on the fix rates of the DRC violations of the new electronic circuit placement layout; and
an engineering change order (ECO) tool configured to fix the HTF DRC violations,
wherein the processor is configured to execute the processing instructions to cause the HTF DRC violation prediction platform to:
train the machine learning model by:
extracting a plurality of feature combinations of the plurality of electronic circuit placement layouts;
calculating fix rates of DRC violations present on the plurality of electronic circuit placement layouts; and
establishing a relationship between the fix rates and the plurality of feature combinations; and
predict the fix rates of the DRC violations of the new electronic circuit placement layout by:
extracting a feature combination of the new electronic circuit placement layout;
normalizing the feature combination of the new electronic circuit placement layout; and
predicting the fix rates of the DRC violations based on the feature combination of the new electronic circuit placement layout and the established relationship between the fix rates and the plurality of feature combinations.

17. The system of claim 16, wherein the machine learning model is a Density-Based Spatial Clustering of Applications with Noise (DBSCAN) model.

18. The system of claim 16, wherein the processor is configured to execute the processing instructions to cause the HTF DRC violation prediction platform to identify the HTF DRC violations based on the fix rates of the DRC violations of the new electronic circuit placement layout by:
comparing the fix rates of the DRC violations of the new electronic circuit placement layout to a threshold fix rate; and
determining that the fix rates of the DRC violations of the new electronic circuit placement layout are HTF DRC violations when the fix rates of the DRC violations of the new electronic circuit placement layout are below the threshold fix rate.

19. The system of claim 16, wherein each of the plurality of feature combinations comprises a DRC violation count in a DRC violation cluster.

20. The system of claim 16, wherein each of the plurality of feature combinations comprises a distance between a scatter DRC violation and a DRC violation cluster box.

* * * * *